(12) United States Patent
Nakano et al.

(10) Patent No.: US 7,173,549 B2
(45) Date of Patent: Feb. 6, 2007

(54) SEMICONDUCTOR INTEGRATED CIRCUIT IN WHICH VOLTAGE DOWN CONVERTER OUTPUT CAN BE OBSERVED AS DIGITAL VALUE AND VOLTAGE DOWN CONVERTER OUTPUT VOLTAGE IS ADJUSTABLE

(75) Inventors: Tadayoshi Nakano, Hyogo (JP); Takashi Nasu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 69 days.

(21) Appl. No.: 10/807,450

(22) Filed: Mar. 24, 2004

(65) Prior Publication Data

US 2005/0052307 A1    Mar. 10, 2005

(30) Foreign Application Priority Data

Sep. 10, 2003    (JP) ............... 2003-318749

(51) Int. Cl.
    *H03M 1/62* (2006.01)
(52) U.S. Cl. .................. 341/139; 341/142; 341/155
(58) Field of Classification Search ............... 341/155, 341/156, 126, 118, 120, 139, 142
    See application file for complete search history.

(56) References Cited

U.S. PATENT DOCUMENTS

| | | | | |
|---|---|---|---|---|
| 4,005,409 A | * | 1/1977 | Feuer | 341/108 |
| 5,254,992 A | * | 10/1993 | Keen et al. | 341/119 |
| 5,329,111 A | * | 7/1994 | Sonoda et al. | 250/208.1 |
| 5,764,541 A | * | 6/1998 | Hermann et al. | 702/98 |
| 6,032,221 A | | 2/2000 | Hongo | |
| 6,285,191 B1 | * | 9/2001 | Gollomp et al. | 324/427 |
| 6,486,731 B2 | | 11/2002 | Yamasaki et al. | |
| 6,664,761 B2 | * | 12/2003 | Yudahira et al. | 320/116 |
| 6,801,146 B2 | * | 10/2004 | Kernahan et al. | 341/122 |
| 6,801,247 B1 | * | 10/2004 | Ohishi et al. | 348/208.1 |
| 6,839,643 B2 | * | 1/2005 | Kanke et al. | 702/45 |
| 6,873,271 B2 | * | 3/2005 | Brachmann et al. | 341/110 |
| 6,961,015 B2 | * | 11/2005 | Kernahan et al. | 341/165 |
| 2004/0244478 A1 | * | 12/2004 | Kanke et al. | 73/204.15 |

FOREIGN PATENT DOCUMENTS

JP    5-325580    10/1993

OTHER PUBLICATIONS

German Office Action dated Mar. 29, 2006 with English-language translation.

* cited by examiner

*Primary Examiner*—Linh Nguyen
(74) *Attorney, Agent, or Firm*—Buchanan Ingersoll & Rooney PC

(57) ABSTRACT

An output voltage of a VDC circuit is subjected to A/D conversion with an on-chip A/D converter. Accordingly, an output voltage VDCout of the VDC circuit can be observed as a digital value, which facilitates measurement. Reduction in the number of terminals leads to reduction in chip size. In addition, the terminal that has been used for providing voltage VDCout can be used for other purposes. Therefore, a semiconductor integrated circuit allowing for easy mass production test and reduced number of man-hours in the mass production test can be provided.

15 Claims, 24 Drawing Sheets

SEMICONDUCTOR INTEGRATED CIRCUIT IN WHICH VOLTAGE DOWN CONVERTER OUTPUT CAN BE OBSERVED AS DIGITAL VALUE AND VOLTAGE DOWN CONVERTER OUTPUT VOLTAGE IS ADJUSTABLE

BACKGROUND OF THE INVENTION

1. Field of the Invention

The present invention relates to a semiconductor integrated circuit.

2. Description of the Background Art

Current supply capability of a booster circuit embedded in a non-volatile memory is extremely low, and a generated high voltage is not resistant to noise or the like. As such, the generated high voltage cannot be output to an external terminal. In such a situation, Japanese Patent Laying-Open No. 5-325580 discloses a technology to check an internal voltage by embedding an A/D (analog/digital) converter for a test, dividing the generated high voltage for conversion by the A/D converter so as to output a resultant digital signal to the outside, and monitoring the digital signal.

On the other hand, integration on a chip of an A/D converter dedicated for a test in order to check an internally generated voltage leads to an increase in a chip area, which is not advantageous in terms of cost.

Recently, a circuit size of a semiconductor integrated circuit has increased as the development of system-on-chip, and accordingly, an increase in the number of man-hours in a mass production shipment test as well as in design verification has been an issue.

In particular in a semiconductor integrated circuit on which a voltage down converter (VDC) and the A/D converter are integrated, design evaluation and mass production test for the voltage down converter, the A/D converter and other logic circuits are currently performed for each individual circuit.

In evaluating whether or not an output voltage of a VDC circuit follows a designed value, or in testing whether or not a voltage output by the VDC circuit is normal in a mass production shipment test, an output voltage VDCout of the VDC circuit needs be provided and measured as an analog value from a terminal of the semiconductor integrated circuit. Therefore, a measurement system has been complicated.

In addition, circuit size of the individual circuit has increased, which leads to an increase in the number of man-hours in mass production test and design evaluation. Moreover, the number of input/output terminals of these semiconductor integrated circuits has increased, and an area for arranging input/output pads is not negligible, considering the chip size of the semiconductor integrated circuit. In particular, when the number of input/output pads increases, the chip size is determined by arrangement of the pads in a peripheral area, not by the size of the circuit arranged in an inner area.

SUMMARY OF THE INVENTION

An object of the present invention is to provide a semiconductor integrated circuit allowing for efficient design evaluation, facilitated mass production test, and reduction in the number of man-hours in the mass production test by utilizing functions of an integrated circuit for testing of another integrated circuit in a semiconductor integrated circuit implemented by integrating a voltage down converter, an A/D converter and other logic circuits. In addition, it is also an object of the present invention to suppress the number of input/output terminals in the semiconductor integrated circuit.

More specifically, the present invention aims to observe a voltage associated with the voltage down converter as a digital value by utilizing a function of the A/D converter as well as to determine the voltage associated with the voltage down converter or to control the same so as to obtain an appropriate voltage. In this manner, the present invention aims to reduce the number of terminals for observing the voltage directly associated with the voltage down converter.

In summary, according to the present invention, a semiconductor integrated circuit includes: a first terminal receiving an external power supply voltage provided from the outside; a voltage generating circuit lowering the external power supply voltage and generating an internal voltage; an internal circuit using a voltage in accordance with the internal voltage; an A/D conversion circuit converting the internal voltage from an analog value to a digital value so as to output a digital signal to the outside; and a second terminal for outputting the digital signal to the outside.

Therefore, the present invention is primarily advantageous in that an internal voltage is output as a digital signal by utilizing the A/D converter integrated on a chip, which will for allow facilitated measurement and reduction in the number of test terminals for voltage monitoring.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
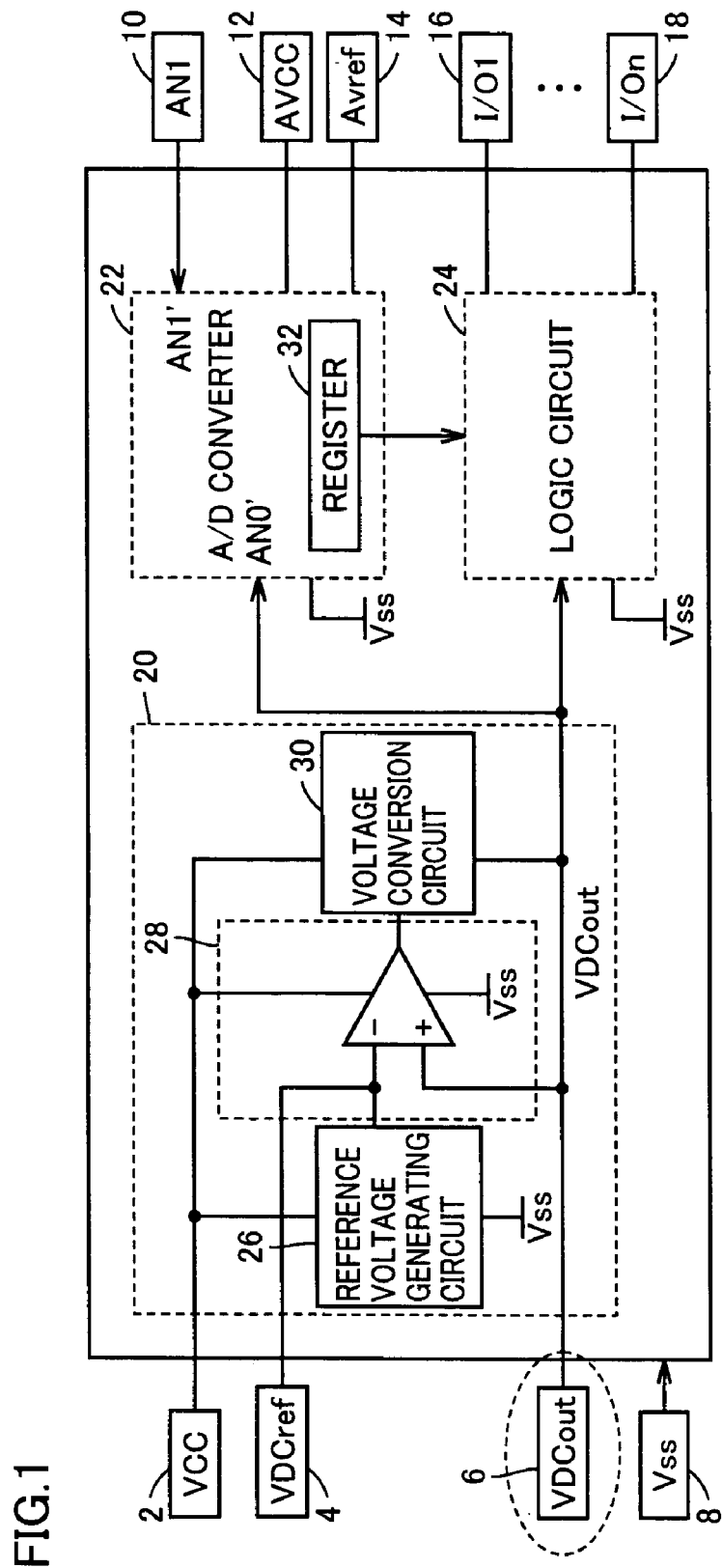
FIG. 1 is a block diagram showing a configuration of a semiconductor integrated circuit 1 in Embodiment 1 of the present invention.

In the following, embodiments of the present invention will be described in detail with reference to the figures. It is noted that the same reference characters refer to the same or corresponding components in the figures.

[Embodiment 1]

FIG. 1 is a block diagram showing a configuration of a semiconductor integrated circuit 1 in Embodiment 1 of the present invention.

Referring to FIG. 1, semiconductor integrated circuit 1 includes terminals 2, 4, 6, 8, 10, 12, 14, and 16 to 18, a voltage down conversion (VDC) circuit 20, an A/D converter 22, and a logic circuit 24.

VDC circuit 20 includes a reference voltage generating circuit 26, a differential amplifier 28, and a voltage conversion circuit 30. A/D converter 22 includes a register 32 storing a result of A/D conversion.

A power supply voltage VCC is supplied for VDC circuit 20 from terminal 2. A power supply voltage AVCC is supplied for A/D converter 22 via terminal 12. A voltage VDCout which is an output of VDC circuit 20 is supplied to logic circuit 24. In other words, respective circuits operate by receiving separate power supply voltages. Here, a ground voltage VSS, that is, ground, is common to each circuit for the sake of simplification of description.

Terminals for VDC circuit 20 include terminal 2 receiving power supply voltage VCC, terminal 4 providing an output voltage VDCref of reference voltage generating circuit 26, and terminal 6 providing voltage VDCout which is the output voltage of VDC circuit 20. Terminals for the A/D converter include terminal 12 for input of power supply voltage AVCC, terminal 14 for providing a reference voltage Avref for A/D conversion, and terminal 10 for input of an analog signal AN 1. Terminals for logic circuit 24 include terminals 16 to 18 for communicating input/output signals with the outside.

Conventionally, all analog inputs of A/D converter 22 have been provided from the outside of the semiconductor integrated circuit, and there has been no input provided from internal VDC circuit 20 or logic circuit 24. This is because the A/D converter has normally been provided in an analog interface portion of an LSI. When an output voltage of VDC circuit 20 or an output voltage of reference voltage generating circuit 26 is to be checked, terminal 6 or 4 outputting such voltages respectively has been observed from the outside of the semiconductor integrated circuit so as to obtain an analog value.

In Embodiment 1, output voltage VDCout of VDC circuit 20 is connected to a signal input node AN0' of A/D converter 22. As such, voltage VDCout is converted from an analog signal to a digital signal by A/D converter 22, and a resultant value is stored in register 32 storing the result of A/D conversion located inside A/D converter 22. Therefore, in order to obtain the output voltage of the VDC circuit generally embedded in the semiconductor integrated circuit, a voltage of a terminal outputting voltage VDCout is observed as an analog value, and it is determined whether or not the VDC circuit operates normally, or whether or not the voltage value is appropriate. In contrast, in the present invention, voltage VDCout can be observed as a digital value stored in register 32. The value in register 32 is read by a logic circuit for reading located in logic circuit 24, and can be provided to the outside of semiconductor integrated circuit 1 from a prescribed terminal for data output among input/output terminals 16 to 18.

Conventionally, for evaluation or a test, it has been necessary to provide output voltage VDCout of the VDC circuit as an analog value from a terminal of the semiconductor integrated circuit for measurement, which has made the measurement system complicated. In contrast, semiconductor integrated circuit 1 of Embodiment 1 subjects the output voltage of the VDC circuit to A/D conversion by the on-chip A/D converter. Accordingly, a value for the output voltage of the VDC circuit can be observed as a digital value, which facilitates measurement.

It has usually been necessary to connect a certain amount of capacitance to terminal 6 in order to stabilize the output of the VDC circuit. On the other hand, if power consumption in logic circuit 24 driven by the output of VDC circuit 20 is low and if load capacity sufficient for stabilizing the output of VDC circuit 20 can be ensured in semiconductor integrated circuit 1, terminal 6 is no longer necessary. Therefore, when the number of terminals determines the chip size of the semiconductor integrated circuit, a space for terminal 6 and also the chip size can be reduced. Moreover, terminal 6 that has been used for outputting voltage VDCout can be used for other purposes.

[Embodiment 2]

Figure 2:
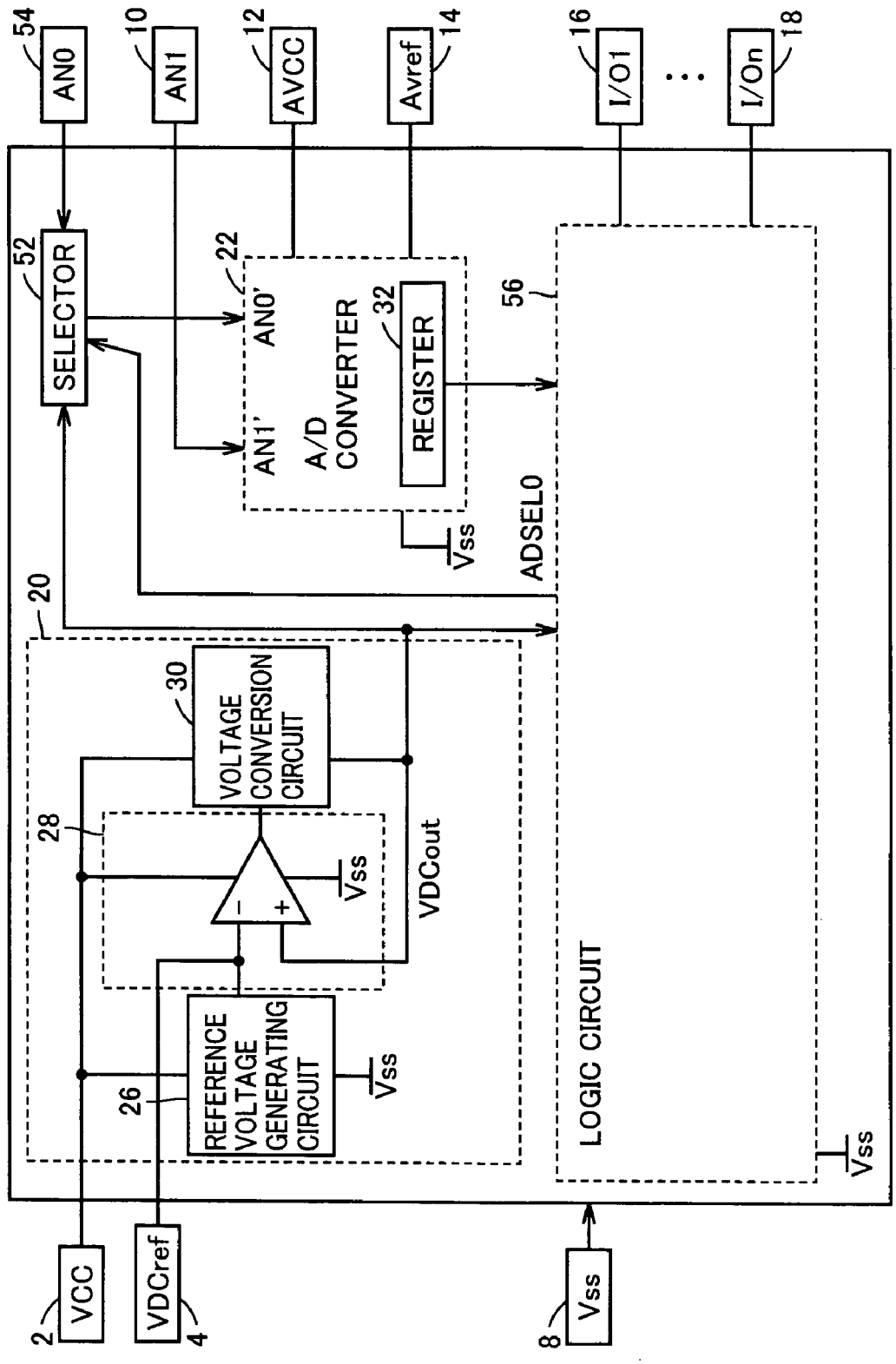
FIG. 2 is a block diagram showing a configuration of a semiconductor integrated circuit 50 in Embodiment 2.

FIG. 2 is a block diagram showing a configuration of a semiconductor integrated circuit 50 in Embodiment 2.

Referring to FIG. 2, semiconductor integrated circuit 50 in Embodiment 2 includes a logic circuit 56 instead of logic circuit 24 in the configuration of semiconductor integrated circuit 1 shown in FIG. 1, and further includes a terminal 54 and a selector 52.

Logic circuit 56 outputs a signal ADSEL0 for selecting an input to the A/D converter. Terminal 54 is provided for input of an analog input signal AN0. Selector 52 selects signal AN0 or voltage VDCout output by VDC circuit 20 in accordance with signal ADSEL0, and provides the selected one to input node AN0' of A/D converter 22.

Embodiment 2 is characterized by selector 52 including two inputs and having an output connected to analog input node AN0' of A/D converter 22.

In Embodiment 1, analog input node AN0' of A/D converter 22 has been coupled to output voltage VDCout of VDC circuit 20. In contrast, in Embodiment 2, voltage VDCout is connected to one input of selector 52, and analog input signal AN0 input from terminal 54 is provided to the other input of selector 52. Logic circuit 56 outputs signal ADSEL0 indicating which to select out of two inputs to selector 52. An input signal selected out of two inputs to selector 52 is provided to analog input node AN0' of A/D converter 22.

If output voltage VDCout of VDC circuit 20 is selected and input to A/D converter 22, voltage VDCout is subjected to A/D conversion by A/D converter 22. A resultant value is stored in register 32. The value in register 32 is read by a not-shown logic circuit for reading in logic circuit 56, and can be provided to the outside of semiconductor integrated circuit 50 from a prescribed terminal for data output among input/output terminals 16 to 18.

When an operation of the VDC circuit is tested and the voltage value is measured, voltage VDCout is output and observed as an analog value from an output voltage terminal connected to the VDC circuit generally contained in the semiconductor integrated circuit. In Embodiment 2, voltage VDCout can be provided via selector 52 to the analog input node of A/D converter 22 integrated on the chip. Therefore, the value for voltage VDCout can be subjected to A/D conversion in the chip and externally observed as a digital value stored in register 32.

In addition, if analog signal AN0 is selected by selector 52 in accordance with signal ADSEL0 output from logic circuit 56 and it is provided to input node AN0' of A/D converter 22, analog signal AN0 is subjected to A/D conversion. Then, a conversion result is stored in register 32. The conversion result of signal AN0 stored in register 32 is also read by the not-shown logic circuit for reading in logic circuit 56, and can be provided to the outside of semiconductor integrated circuit 50 from the prescribed terminal for data output among input/output terminals 16 to 18.

According to Embodiment 2, by providing selector 52, input node AN0' of A/D converter 22 can be shared for the purposes of measuring the output voltage of VDC circuit 20 and measuring the input of analog signal AN0 provided externally. Therefore, determination of the operation of VDC circuit 20 or evaluation and observation of the value for voltage VDCout can be performed without reducing the number of available terminals among analog input terminals of semiconductor integrated circuit 50.

Though a selector having two inputs and one output has been employed in Embodiment 2, a selector having two or more inputs may be employed. In such an example, output voltage VDCout of the VDC circuit can be selected from signals including further other signals, and an effect the same as in the invention of Embodiment 2 can be obtained.

[Embodiment 3]

Figure 3:
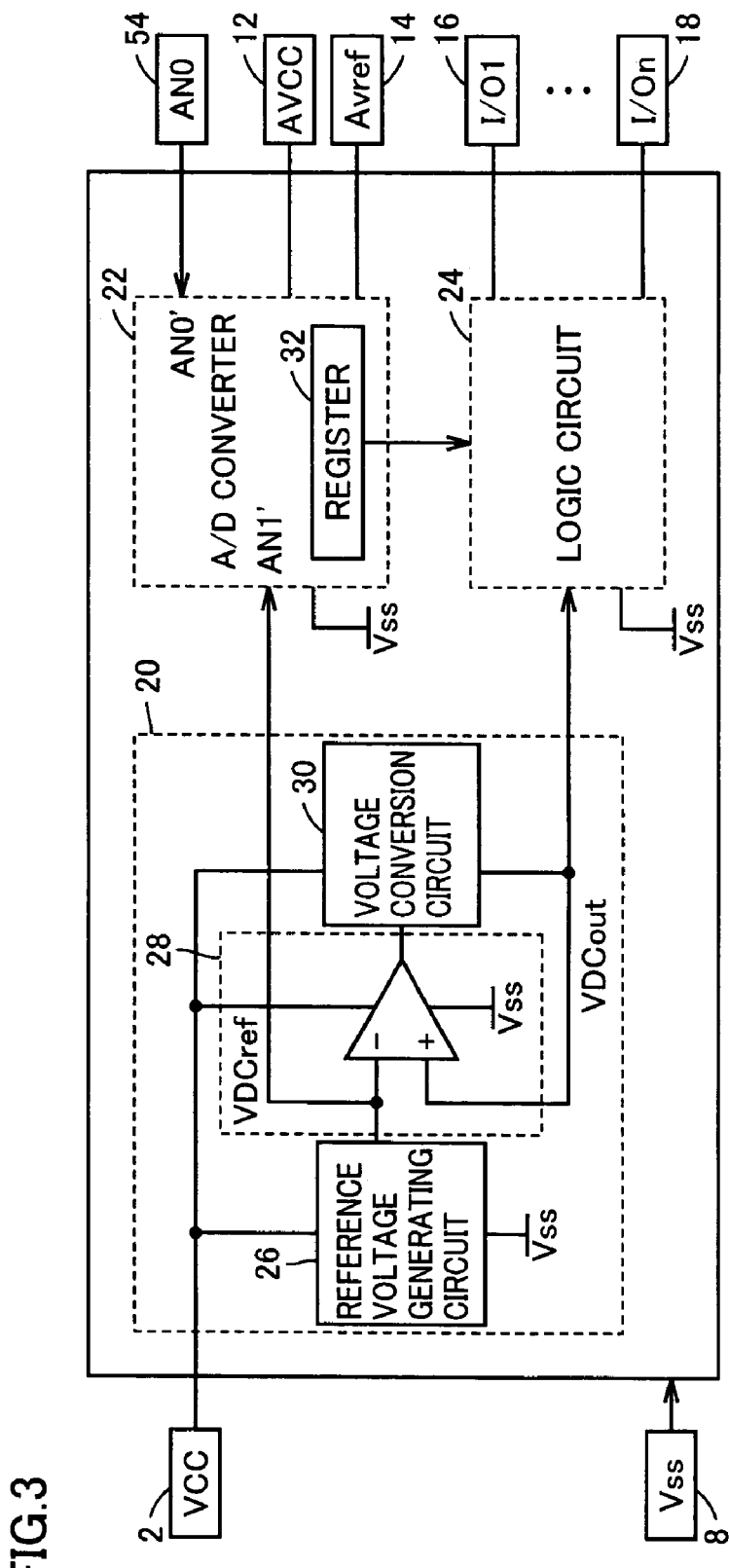
FIG. 3 is a block diagram showing a configuration of a semiconductor integrated circuit 60 in Embodiment 3.

FIG. 3 is a block diagram showing a configuration of a semiconductor integrated circuit 60 in Embodiment 3.

Referring to FIG. 3, semiconductor integrated circuit 60 includes terminal 54 for providing analog signal AN0, whereas terminals 4, 6 and 10 are eliminated from the configuration of semiconductor integrated circuit 1 shown in FIG. 1. A/D converter 22 receives analog signal AN0 provided to input node AN0' via terminal 54, and receives reference voltage VDCref output by reference voltage generating circuit 26 at an input node AN1'. The configuration is otherwise the same as that shown in FIG. 1, and description thereof will not be repeated.

VDC circuit 20 inputs output voltage VDCout of VDC circuit 20 and reference voltage VDCref which is the output voltage of reference voltage generating circuit 26 to differential amplifier 28. Differential amplifier 28 controls voltage conversion circuit 30 in accordance with a difference between these voltages, whereby voltage VDCout and voltage VDCref are regulated to attain the same voltage.

In a general configuration, in order to evaluate from the outside of the chip whether or not reference voltage VDCref is generated by reference voltage generating circuit 26 as designed, voltage VDCref is provided to the outside via a terminal.

In contrast, in the configuration of semiconductor integrated circuit 60 according to Embodiment 3, voltage VDCref is coupled to input node AN1' of A/D converter 22. Voltage VDCref is converted by A/D converter 22 in the chip, and a resultant value is stored in register 32. Therefore, generally, voltage VDCref has externally been observed as an analog value via the output voltage terminal, whereas in Embodiment 3, voltage VDCref can be observed as a digital value stored in register 32. The value in register 32 is read by a logic circuit for reading located in logic circuit 24, and can be provided to the outside of semiconductor integrated circuit 60 from a prescribed terminal for data output among input/output terminals 16 to 18.

As described above, the measurement system has conventionally been complicated. In semiconductor integrated circuit 60 of Embodiment 3, however, the output of reference voltage generating circuit 26 is converted by A/D converter 22 and the voltage value can be observed as a digital value. Thus, measurement of voltage VDCref is facilitated, and cost for verification and measurement can be reduced.

In addition, the number of terminals for providing voltage VDCref to the outside of the chip can be reduced. In this manner, physical space for the terminals is reduced. Namely, when the number of terminals determines the chip size, the chip size can be reduced. Even if it is not the case, the terminal can be used for other purposes.

[Embodiment 4]

Figure 4:
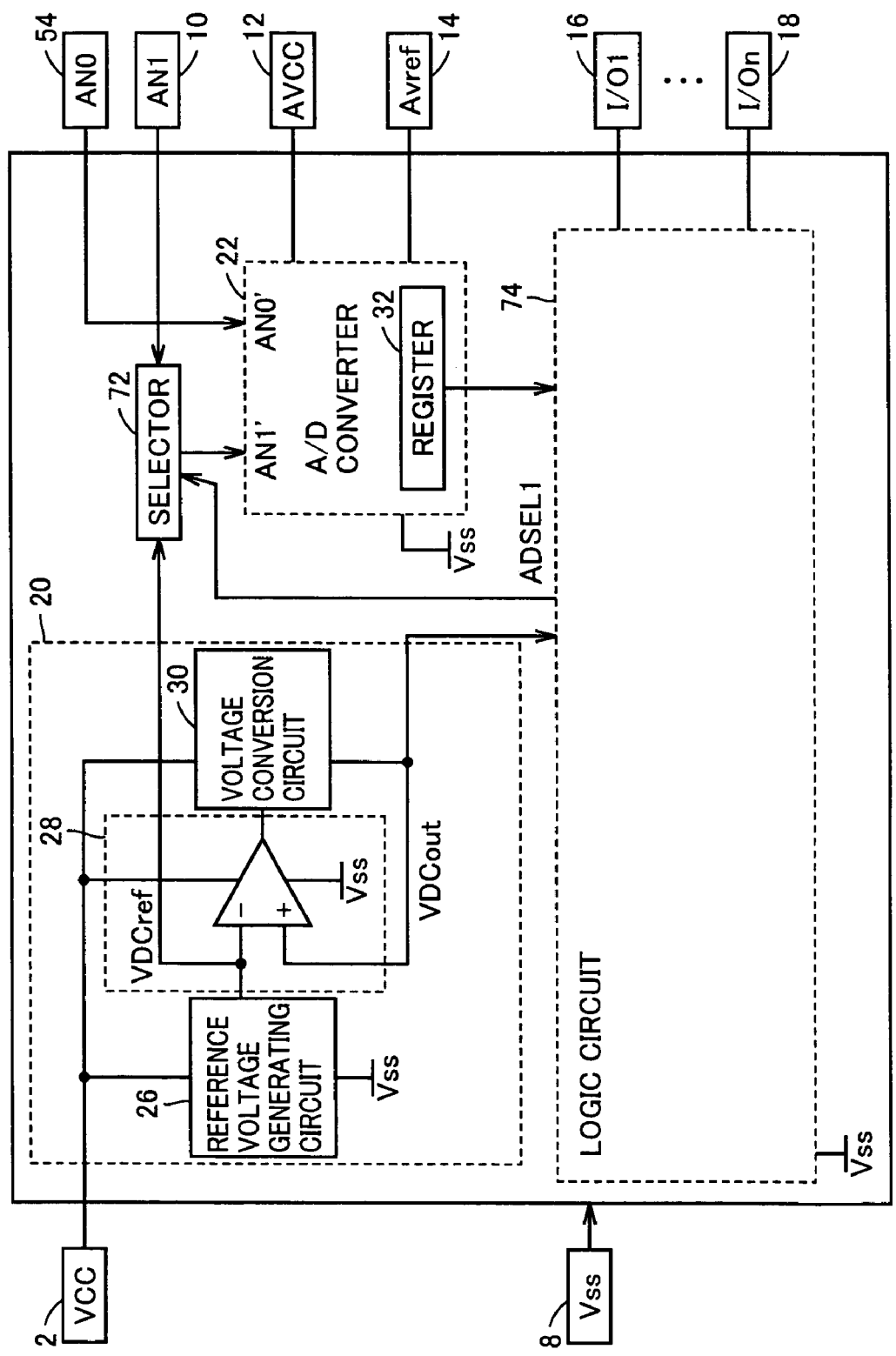
FIG. 4 is a block diagram showing a configuration of a semiconductor integrated circuit 70 in Embodiment 4.

FIG. 4 is a block diagram showing a configuration of a semiconductor integrated circuit 70 in Embodiment 4.

Referring to FIG. 4, semiconductor integrated circuit 70 includes a logic circuit 74 instead of logic circuit 24 in the configuration of semiconductor integrated circuit 60 shown in FIG. 3, and further includes a selector 72 and terminal 10. The configuration is otherwise the same as that of semiconductor integrated circuit 60 in FIG. 3, and description thereof will not be repeated.

Selector 72 receives an analog input signal AN1 provided via terminal 10 and reference voltage VDCref output by reference voltage generating circuit 26 as input signals. Selector 72 selects one of the two inputs in accordance with a signal ADSEL1 output from logic circuit 74, and provides the selected signal to input node AN1' of A/D converter 22.

If reference voltage VDCref is selected by selector 72 and input to A/D converter 22, reference voltage VDCref is subjected to A/D conversion, and a resultant value is stored in register 32. The value in register 32 is read by a not-shown logic circuit for reading in logic circuit 74, and can be provided to the outside of semiconductor integrated circuit 70 from a prescribed terminal for data output among input/output terminals 16 to 18.

When an operation of the VDC circuit is tested and the voltage value is measured, generally, reference voltage VDCref is output and observed as an analog value from a terminal of the semiconductor integrated circuit. In contrast, in Embodiment 4, since reference voltage VDCref can be connected to input node AN1' of A/D converter 22 via selector 72, it can be subjected to A/D conversion in the chip using A/D converter 22. Therefore, reference voltage VDCref can be observed as a digital value stored in register 32.

According to Embodiment 4, by providing selector 72, input node AN1' of A/D converter 22 can be shared for the purposes of measuring the reference voltage of VDC circuit 20 and measuring the input of analog signal AN1 provided externally. Therefore, determination of the operation of VDC circuit 20 or evaluation and observation of the value for voltage VDCref can be performed without reducing the number of available terminals among analog input terminals of semiconductor integrated circuit 70.

Though a selector having two inputs and one output has been employed in Embodiment 4, a selector having two or more inputs may be employed. In such an example, reference voltage VDCref of the VDC circuit can be selected from signals including further other signals, and an effect the same as in the invention of Embodiment 4 can be obtained.

[Embodiment 5]

Figure 5:
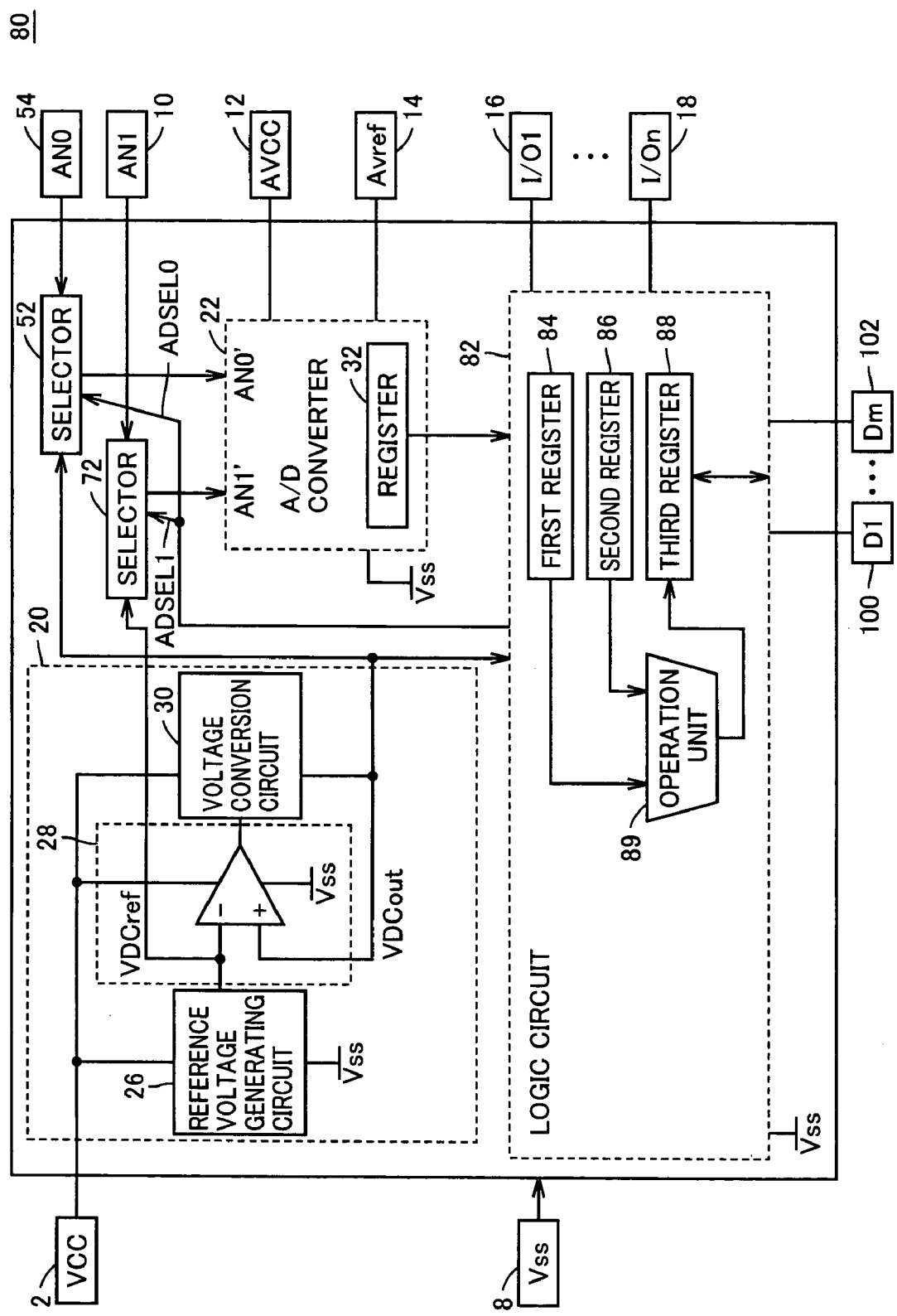
FIG. 5 is a block diagram showing a configuration of a semiconductor integrated circuit 80 in Embodiment 5

FIG. 5 is a block diagram showing a configuration of a semiconductor integrated circuit 80 in Embodiment 5

Referring to FIG. 5, semiconductor integrated circuit 80 has VDC circuit 20, A/D converter 22, a logic circuit 82, and selectors 52, 72 integrated on one semiconductor chip. Each circuit has a dedicated input/output terminal.

With regard to the power supply, VDC circuit 20 is provided with terminal 2 for providing power supply voltage VCC, and A/D converter 22 is provided with terminal 12 for providing power supply voltage AVCC. Voltage VDCout which is the output of VDC circuit 20 is supplied to logic circuit 82. In other words, VDC circuit 20, A/D converter 22 and logic circuit 82 operate by receiving separate power supply voltages respectively. On the other hand, ground voltage VSS, that is, ground, is common to these three circuit blocks.

As terminals for A/D converter 22, terminal 14 for inputting reference voltage Avref for A/D conversion and terminals 54, 10 for inputting analog input signals AN0, AN1 respectively are further provided. Though A/D converter 22 includes two inputs of input nodes AN1', AN0', it may include larger number of analog inputs. Selector 52 receives analog signal AN0 provided via terminal 54 and voltage VDCout output from VDC circuit 20 as two input signals, and selects one of those inputs in accordance with signal ADSEL0 provided from logic circuit 82. Selector 52 then outputs the selected signal to input node AN0' of A/D converter 22.

Selector 72 receives analog input signal AN1 provided via terminal 10 and reference voltage VDCref output by reference voltage generating circuit 26 as two input signals. Selector 72 selects one of two inputs in accordance with signal ADSEL1 output from logic circuit 82, and provides the selected signal to input node AN1' of A/D converter 22.

Terminals 16 to 18 and 100 to 102 are provided for logic circuit 82. Terminals 16 to 18 are n (n is a natural number) terminals for inputting/outputting signals I/O1 to I/On as a control signal or data to/from the outside of semiconductor integrated circuit 80. Meanwhile, terminals 100 to 102 are m (m is a natural number) terminals provided for inputting/outputting data in registers 84, 86, 88 in logic circuit 82 as data D1 to Dm to/from the outside of semiconductor integrated circuit 80.

VDC circuit 20 includes reference voltage generating circuit 26, differential amplifier 28, and voltage conversion circuit 30. Reference voltage generating circuit 26 generates reference voltage VDCref serving as the reference of voltage VDCout output by VDC circuit 20. Upon receiving reference voltage VDCref and voltage VDCout, differential amplifier 28 transmits a signal to voltage conversion circuit 30 so as to raise voltage VDCout, if voltage VDCout is lower than voltage VDCref On the other hand, differential amplifier 28 transmits an output signal to voltage conversion circuit 30 so as not to raise voltage VDCout, if voltage VDCout is higher than voltage VDCref. Upon receiving the output signal from differential amplifier 28, voltage conversion circuit 30 generates a prescribed voltage VDCout lower than power supply voltage VCC from the same.

An operation of A/D converter 22 can be set by a signal from logic circuit 82. A/D converter 22 subjects analog signals input from input nodes AN0', AN1' to A/D conversion, and a conversion result is stored in register 32 as a digital value.

Logic circuit 82 outputs signals ADSEL0, ADSEL1 for selecting inputs of two-input selectors 52, 72 respectively. Logic circuit 82 can read the value in register 32 in A/D converter 22.

Logic circuit 82 includes a first register 84, a second register 86, a third register 88, and an operation unit 89. Operation unit 89 subtracts a value in second register 86 from a value in first register 84, and a resultant value can be stored in third register 88.

An overall operation of semiconductor integrated circuit 80 in Embodiment 5 will now be described.

In accordance with signals ADSEL0, ADSEL1 from logic circuit 82, selector 52 selects voltage VDCout output by voltage conversion circuit 30. Selector 72 selects reference voltage VDCref output by reference voltage generating circuit 26 in accordance with signal ADSEL1. Voltage VDCout is subjected to A/D conversion by A/D converter 22 in the chip, and a conversion result is stored in register 32. The value in register 32 is read by logic circuit 82, and the digital value of voltage VDCout is stored in first register 84.

Reference voltage VDCref is subjected to A/D conversion by A/D converter 22, and a conversion result is stored in register 32. The digital value of reference voltage VDCref is read from register 32 by logic circuit 82, and the read value is stored in second register 86.

Operation unit 89 in logic circuit 82 receives the values in first register 84 and second register 86 as inputs, and calculates a difference between those values (the value in the first register—the value in the second register), which can be stored in third register 88.

The values held in first register 84, second register 86 and third register 88 can be read as data D1 to Dm via terminals 100 to 102 from the outside of semiconductor integrated circuit 80.

In Embodiment 5, not only the digital value of output voltage VDCout of the VDC circuit and the digital value of reference voltage VDCref, but also the digital value of the differential voltage between them can be observed from the outside of semiconductor integrated circuit 80. Therefore, as compared with an example in which these voltages are externally observed as analog values, evaluation of the operation of the VDC circuit can be performed in a more simplified and easier manner. In other words, information for modifying the value for input power supply voltage VCC or reference voltage VDCref so that the output of the VDC circuit attains a voltage optimal for the operation of the internal logic circuit (characteristic data of input voltage versus output voltage) can be obtained in a short period of time. Based on such information, the input value of power supply voltage VCC is determined or a mask layout is modified, so as to re-fabricate a chip. In this manner, a desired output voltage can be obtained.

In addition, logical operation of voltage VDCout and reference voltage VDCref which is an expected value thereof can be performed. Therefore, whether or not voltage VDCout attains an abnormal value can readily be determined by an operation of logic circuit 82.

[Embodiment 6]

Figure 6:
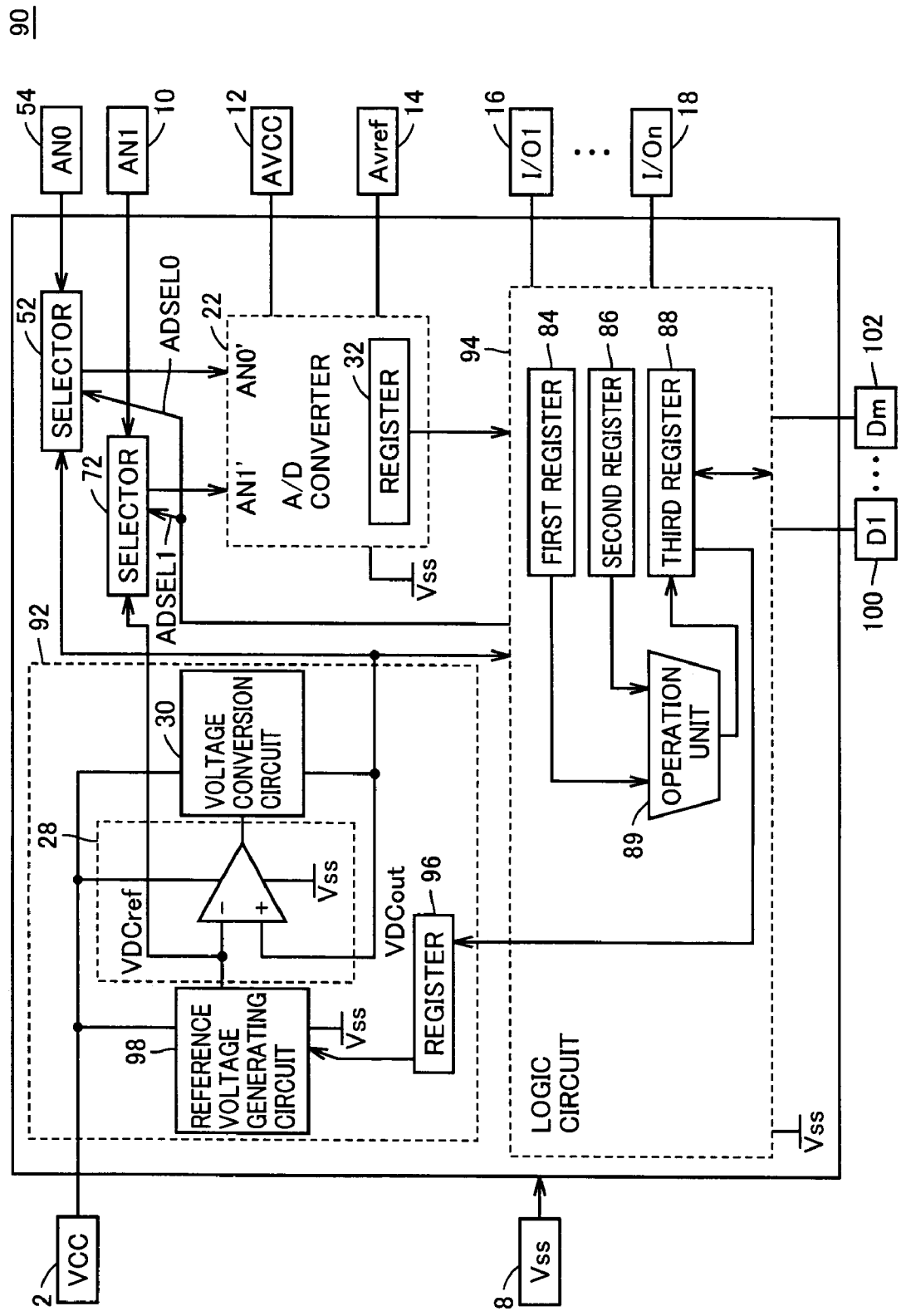
FIG. 6 is a block diagram showing a configuration of a semiconductor integrated circuit 90 in Embodiment 6.

FIG. 6 is a block diagram showing a configuration of a semiconductor integrated circuit 90 in Embodiment 6.

Referring to FIG. 6, semiconductor integrated circuit 90 has a VDC circuit 92, A/D converter 22, a logic circuit 94, and selectors 52, 72 integrated on one semiconductor chip. Each circuit has a dedicated input/output terminal.

With regard to the power supply, VDC circuit 92 is supplied with power supply voltage VCC via terminal 2, and A/D converter 22 is supplied with power supply voltage AVCC via terminal 12. Voltage VDCout which is the output of VDC circuit 92 is supplied to logic circuit 94. In other words, VDC circuit 92, A/D converter 22 and logic circuit 94 operate by receiving separate power supply voltages respectively. Here, ground voltage VSS, that is, ground, is common to these three circuits.

Upon receiving power supply voltage VCC, VDC circuit 92 internally generates reference voltage VDCref and outputs voltage VDCout as the output. A/D converter 22 subjects two analog input signals provided to input nodes AN0', AN1' to A/D conversion referring to reference voltage Avref for A/D conversion, and a conversion result is stored in register 32.

Selector 52 is a two-input selector, and has its output connected to input node AN0' of the A/D converter. Selector 72 is also a two-input selector, and has its output connected to input node AN1' of A/D converter 22.

Analog signal AN0 provided via terminal 54 is provided to one input of selector 52, and voltage VDCout which is the output of voltage conversion circuit 30 is provided to the other input thereof. In addition, analog signal AN1 provided via terminal 10 is provided to one input of selector 72, and reference voltage VDCref which is the output of a reference voltage generating circuit 98 is provided to the other input of selector 72.

Logic circuit 94 communicates signals I/O1 to I/On via n terminals 16–18 as a control signal or data. Logic circuit 94 also inputs/outputs data in the embedded register via terminals 100 to 102 as data D1 to Dm.

VDC circuit 92 includes reference voltage generating circuit 98, differential amplifier 28, and voltage conversion circuit 30. Reference voltage generating circuit 98 generates reference voltage VDCref serving as the reference of voltage VDCout which is the output of VDC circuit 92. Differential amplifier 28 receives voltage VDCref and voltage VDCout as inputs. Differential amplifier 28 outputs a control signal to voltage conversion circuit 30 so as to raise voltage VDCout, if voltage VDCout is lower than voltage VDCref.

On the other hand, differential amplifier 28 outputs a control signal to voltage conversion circuit 30 so as not to raise voltage VDCout, if voltage VDCout is higher than voltage VDCref. Upon receiving the control signal from differential amplifier 28, voltage conversion circuit 30 generates a prescribed voltage VDCout lower than power supply voltage VCC from the same.

An operation of A/D converter 22 can be set by a signal from logic circuit 94. A/D converter 22 subjects analog signals input from input nodes AN0', AN1' to A/D conversion, and a conversion result is stored in register 32 as a digital value.

Logic circuit 94 outputs signals ADSEL0, ADSEL1 for selecting inputs of selectors 52, 72. Logic circuit 94 can also read the value in register 32 in A/D converter 22.

Logic circuit 94 includes first register 84, second register 86, third register 88, and operation unit 89. Logic circuit 94 can store in third register 88, a result obtained by subtracting a value in second register 86 from a value in first register 84 by means of operation unit 89.

VDC circuit 92 includes reference voltage generating circuit 98. Reference voltage generating circuit 98 can provide an output voltage serving as the reference, one voltage or a plurality of voltages higher than the output voltage, and one voltage or a plurality of voltages lower than the output voltage.

VDC circuit 92 further includes a register 96 for controlling the reference voltage. In accordance with the value in register 96, one of the plurality of voltages that reference voltage generating circuit 98 can generate can be selected. Though register 96 is arranged in VDC circuit 92 in FIG. 6, it may be arranged in logic circuit 94 or in another area.

Figure 7:
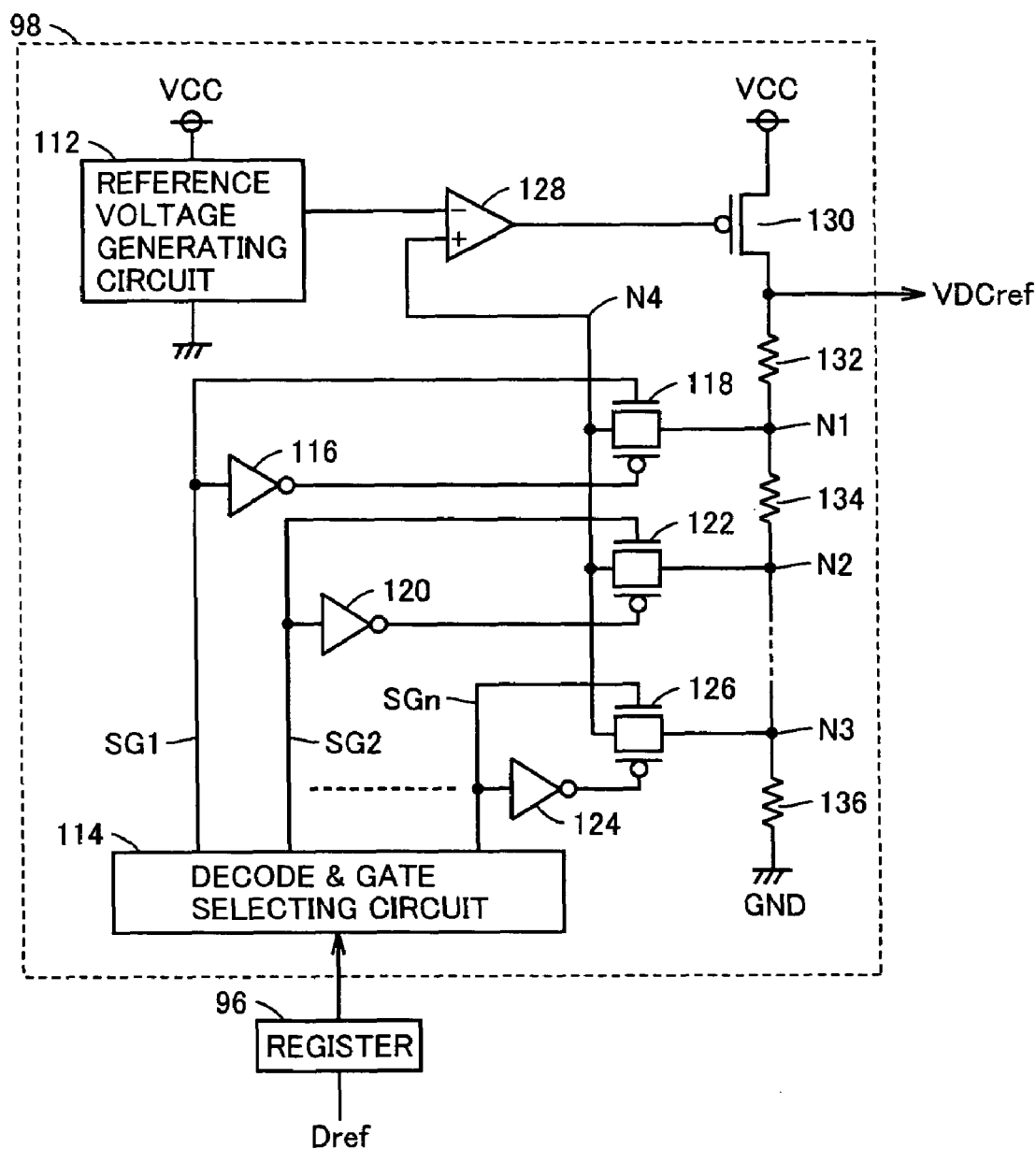
FIG. 7 is a circuit diagram showing a configuration of a reference voltage generating circuit 98 in FIG. 6.

FIG. 7 is a circuit diagram showing a configuration of reference voltage generating circuit 98 in FIG. 6.

Referring to FIG. 7, reference voltage generating circuit 98 includes a reference voltage generating circuit 112 generating a reference voltage using a band gap, and a decode & gate selecting circuit 114 decoding the output of register 96 set by a control signal Dref from the logic circuit so as to output a signal for controlling gate selection. Decode & gate selecting circuit 114 outputs signals SG1 to SGn as control signals.

Reference voltage generating circuit 98 further includes an inverter 116 inverting signal SG1, an inverter 120 inverting signal SG2, and an inverter 124 inverting signal SGn.

Reference voltage generating circuit 98 further includes an amplifier 128 receiving an output of reference voltage generating circuit 112 at its minus input node and having its plus input node connected to a node N4; a P-channel MOS transistor 130 receiving an output of amplifier 128 at the gate and having the source coupled to power supply voltage VCC; a resistor 132 connected between the drain of P-channel MOS transistor 130 and a node N1; a resistor 134 connected between node N1 and a node N2; and a resistor 136 connected between a node N3 and a ground node. Reference voltage VDCref is output from the source of P-channel MOS transistor 130. It is to be noted that a prescribed number of resistors connected in series are provided between node N3 and node N2.

Reference voltage generating circuit 98 further includes a transmission gate 118 connecting node N1 and node N4 in accordance with signal SG1 and an output of inverter 116; a transmission gate 122 connecting node N2 and node N4 in accordance with signal SG2 and an output of inverter 120; and a transmission gate 126 connecting node N3 and node N4 in accordance with signal SGn and an output of inverter 124.

Voltage VDCref is divided into a plurality of divided voltages by resistors 132, 134, . . . , 136, and one of the divided voltages is selected by transmission gates 118, 122, . . . , 126 and input to node N4. Amplifier 128 compares the selected divided voltages with the output of reference voltage generating circuit 112, so as to control conduction of P-channel MOS transistor 130.

Referring back to FIG. 6, an overall operation of semiconductor integrated circuit 90 will now be described.

In accordance with signal ADSEL0 from logic circuit 94, selector 52 selects voltage VDCout output by voltage conversion circuit 30. Selector 72 selects reference voltage VDCref in accordance with signal ADSEL1 output by logic circuit 94.

Voltage VDCout is subjected to A/D conversion by A/D converter 22, and a conversion result is stored in register 32.

The value in register 32 is read by logic circuit 94, and the read value is stored in first register 84.

In addition, reference voltage VDCref is subjected to A/D conversion by A/D converter 22, and an A/D conversion result is stored in register 32. The value in register 32 is read by logic circuit 94, and the read value is stored in second register 86. Referring to the values in first register 84 and second register 86, operation unit 89 in logic circuit 94 calculates a difference between those two values (the value in the first register—the value in the second register), and a resultant value can be stored in third register 88.

Contents in first register 84, second register 86 and third register 88 within logic circuit 94 can be read as data D1 to Dm via terminals 100 to 102 from the outside of semiconductor integrated circuit 90.

If reference voltage VDCref needs to be modified as a result of reading the values in first register 84, second register 86 and third register 88 from the outside of semiconductor integrated circuit 90, a numerical value indicating a difference from current reference voltage VDCref is written into third register 88. By writing the content in third register 88 into register 96 under the control of logic circuit 94, reference voltage VDCref output by reference voltage generating circuit 98 can be modified.

In Embodiment 6, the values in first register 84, second register 86 and third register 88 are read to the outside of semiconductor integrated circuit 90 so as to calculate a reference voltage suitable for operational conditions, and a difference from the current reference voltage is written into register 96 of VDC circuit 92. In this manner, reference voltage VDCref can be modified. Thus, semiconductor integrated circuit 90 can attain an operation with larger margin. In addition, in an initial operation such as power-on of the semiconductor integrated circuit, a control device capable of executing a boot program for setting operation can be arranged outside semiconductor integrated circuit 90, whereby reference voltage VDCref for VDC circuit 92 can be regulated each time of use.

[Embodiment 7]

Figure 8:
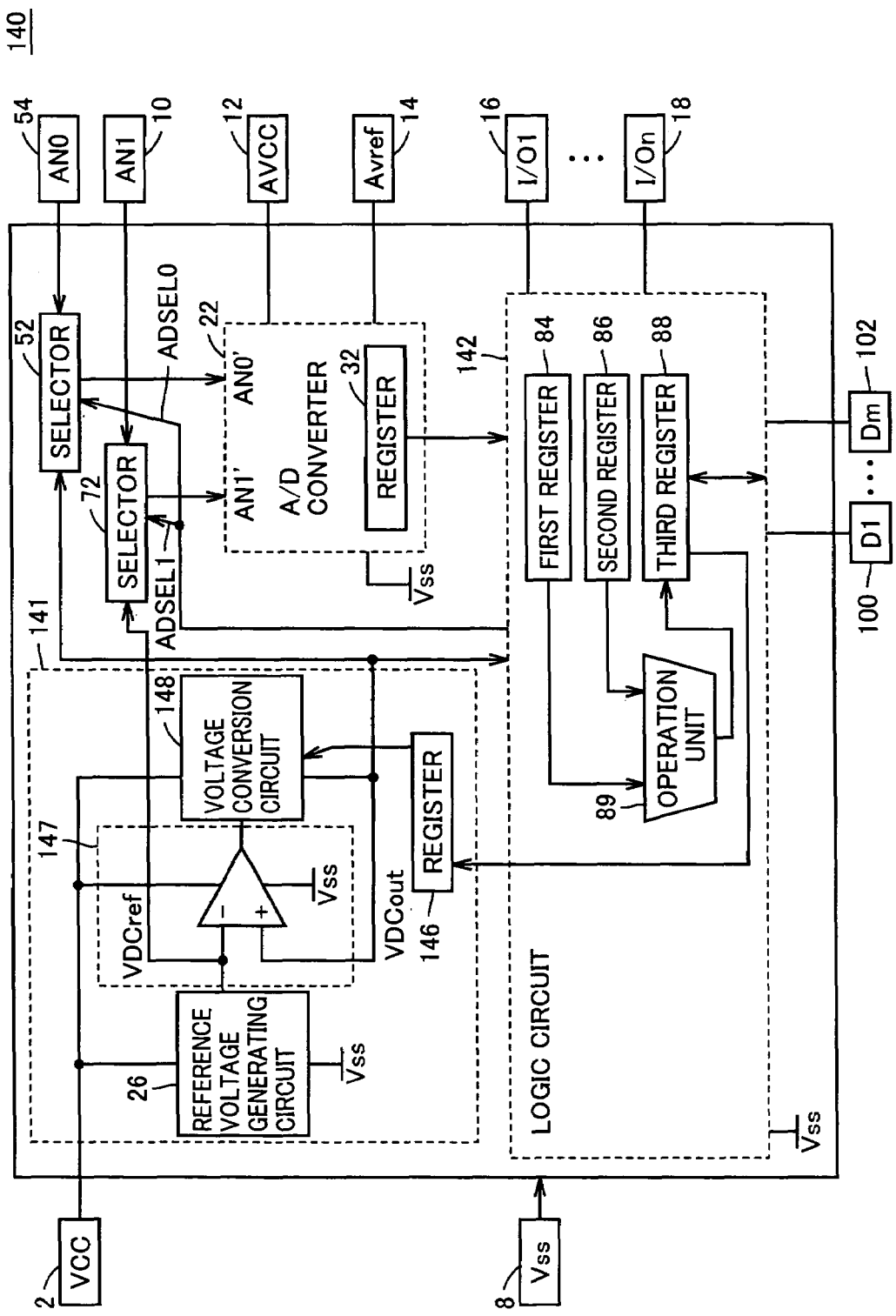
FIG. 8 is a block diagram showing a configuration of a semiconductor integrated circuit 140 in Embodiment 7.

FIG. 8 is a block diagram showing a configuration of a semiconductor integrated circuit 140 in Embodiment 7.

Referring to FIG. 8, semiconductor integrated circuit 140 has a VDC circuit 141, A/D converter 22, a logic circuit 142, and selectors 52, 72 integrated on one semiconductor chip. Each circuit has a dedicated input/output terminal.

With regard to the power supply, VDC circuit 141 is supplied with power supply voltage VCC via terminal 2, and A/D converter 22 is supplied with power supply voltage AVCC via terminal 12. Voltage VDCout which is the output of VDC circuit 141 is supplied to logic circuit 142. In other words, VDC circuit 141, A/D converter 22 and logic circuit 142 operate by receiving separate power supply voltages respectively. Here, ground voltage VSS, that is, ground, is common to these three circuits.

Upon receiving power supply voltage VCC, VDC circuit 141 internally generates reference voltage VDCref and outputs voltage VDCout as the output. A/D converter 22 subjects two analog input signals provided to input nodes AN0', AN1' to A/D conversion referring to reference voltage Avref for A/D conversion, and a conversion result is stored in register 32.

Selector 52 is a two-input selector, and has its output connected to input node AN0' of the A/D converter. Selector 72 is also a two-input selector, and has its output connected to input node AN1' of A/D converter 22.

Analog signal AN0 provided via terminal 54 is provided to one input of selector 52, and voltage VDCout which is the output of voltage conversion circuit 148 is provided to the other input thereof. In addition, analog signal AN1 provided via terminal 10 is provided to one input of selector 72, and reference voltage VDCref which is the output of reference voltage generating circuit 26 is provided to the other input of selector 72.

Logic circuit 142 communicates signals I/O1 to I/On via n terminals 16–18 as a control signal or data. Logic circuit 142 also inputs/outputs data in the embedded register via terminals 100 to 102 as data D1 to Dm.

VDC circuit 141 includes reference voltage generating circuit 26, a differential amplifier 147, and voltage conversion circuit 148. Reference voltage generating circuit 26 generates reference voltage VDCref serving as the reference of voltage VDCout which is the output of VDC circuit 141.

Differential amplifier 147 receives voltage VDCref and voltage VDCout as inputs. Differential amplifier 147 outputs a control signal to voltage conversion circuit 148 so as to raise voltage VDCout, if voltage VDCout is lower than voltage VDCref On the other hand, differential amplifier 147 outputs a control signal to voltage conversion circuit 148 so as not to raise voltage VDCout, if voltage VDCout is higher than voltage VDCref Upon receiving the control signal from differential amplifier 147, voltage conversion circuit 148 generates a prescribed voltage VDCout lower than power supply voltage VCC from the same.

An operation of A/D converter 22 can be set by a signal from logic circuit 142. A/D converter 22 subjects analog signals input from input nodes AN0', AN1' to A/D conversion, and a conversion result is stored in register 32 as a digital value.

Logic circuit 142 outputs signals ADSEL0, ADSEL1 for selecting inputs of selectors 52, 72. Logic circuit 142 can also read the value in register 32 in A/D converter 22.

Logic circuit 142 includes first register 84, second register 86, third register 88, and operation unit 89. Logic circuit 142 can store in third register 88, a result obtained by subtracting a value in second register 86 from a value in first register 84 by means of operation unit 89.

Voltage conversion circuit 148 in VDC circuit 141 includes a plurality of current driving circuits. Normally, a prescribed number of current driving circuits operate. The number of current driving circuits that operate can be varied in accordance with the value in register 146. When the value in register 146 is negative, the number of current driving circuits increases. Meanwhile, when the value in register 146 is positive, the number of current driving circuits decreases. Though register 146 for controlling current drivability is arranged in VDC circuit 141 in Embodiment 7, register 146 may be arranged in logic circuit 142 or in another area. The value in third register 88 can be transferred to register 146 under the control of logic circuit 142.

Figure 9:
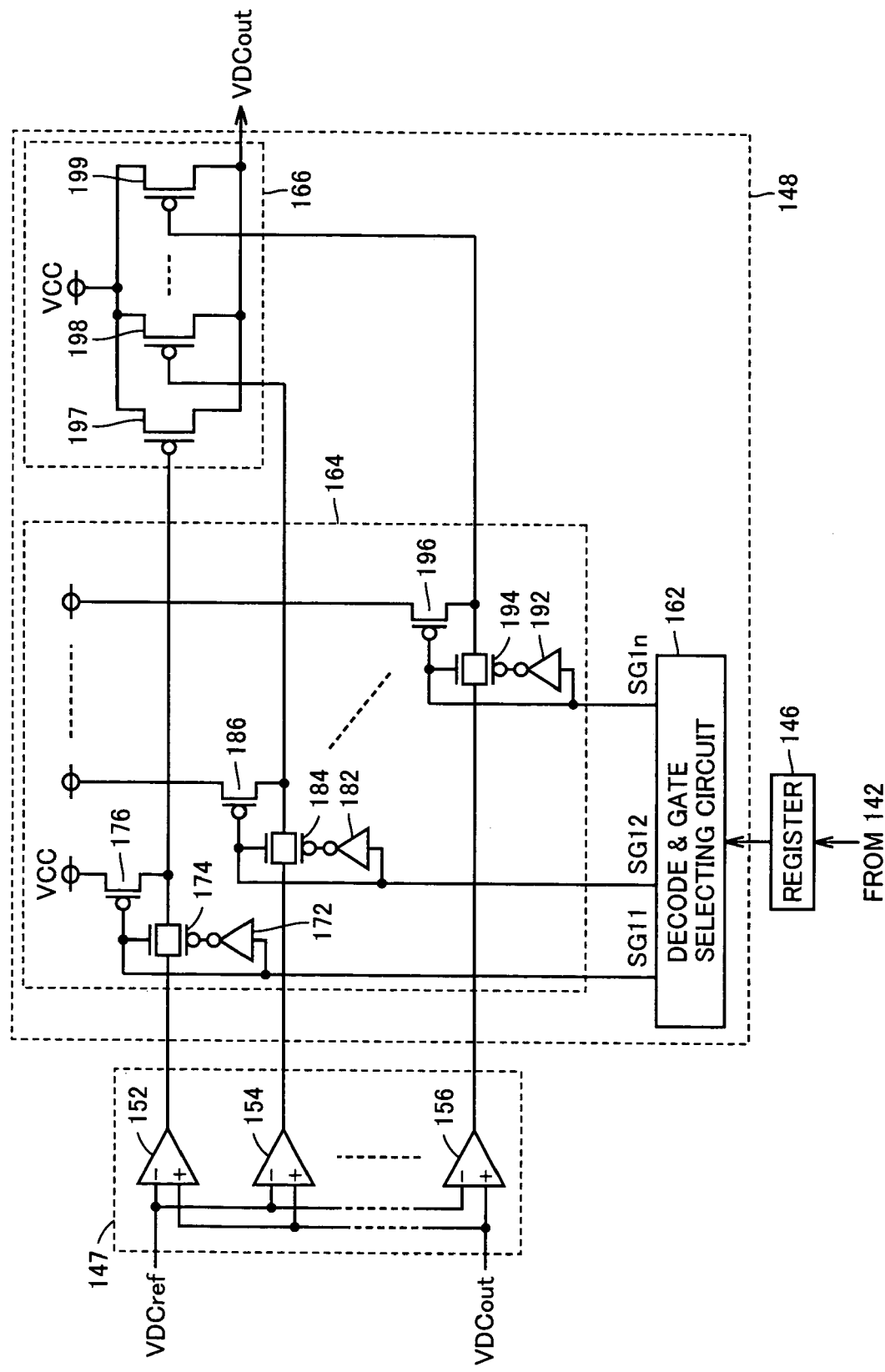
FIG. 9 is a circuit diagram showing a configuration of a differential amplifier 147 and a voltage conversion circuit 148 in FIG. 8.

FIG. 9 is a circuit diagram showing a configuration of differential amplifier 147 and voltage conversion circuit 148 in FIG. 8.

Referring to FIG. 9, differential amplifier 147 includes comparator circuits 152, 154, . . . , 156 receiving reference voltage VDCref at respective minus input nodes and receiving voltage VDCout at respective plus input nodes. Voltage conversion circuit 148 includes a decode & gate selecting circuit 162 decoding an output of register 146 so as to output signals SG1, SG12, . . . , SG1n; an input switching circuit 164 performing input switching in accordance with signals SG11 to SG1n; and a driving circuit 166 having drivability variable in accordance with an output of input switching circuit 164. Driving circuit 166 includes P-channel MOS transistors 197, 198, 199 serving as a plurality of current driving circuits. P-channel MOS transistors 197, 198, 199 are connected in parallel between a power supply node and a node outputting voltage VDCout.

Input switching circuit 164 includes an inverter 172 receiving and inverting signal SG11, a P-channel MOS transistor 176 connected between the power supply node and the gate of P-channel MOS transistor 197 and receiving signal SG11 at its gate, and a transmission gate 174 connecting an output of comparator circuit 152 to the gate of P-channel MOS transistor 197 in accordance with signal SG11 and an output of inverter 172.

Referring back to FIG. 8, an overall operation of semiconductor integrated circuit 140 will now be described.

In accordance with signal ADSEL0 from logic circuit 142, selector 52 selects voltage VDCout output by voltage conversion circuit 148. Selector 72 selects reference voltage VDCref in accordance with signal ADSEL1 output by logic circuit 142.

Voltage VDCout is subjected to A/D conversion by A/D converter 22, and a conversion result is stored in register 32. The value in register 32 is read by logic circuit 142, and the read value is stored in first register 84.

In addition, reference voltage VDCref is subjected to A/D conversion by A/D converter 22, and an A/D conversion result is stored in register 32. The value in register 32 is read by logic circuit 142, and the read value is stored in second register 86. Referring to the values in first register 84 and second register 86, operation unit 89 in logic circuit 142 calculates a difference between those two values (the value in the first register—the value in the second register), and a resultant value can be stored in third register 88.

The contents in first register 84, second register 86 and third register 88 within logic circuit 142 can be read as data D1 to Dm via terminals 100 to 102 from the outside of semiconductor integrated circuit 140.

As the current consumed by logic circuit 142 becomes large, voltage VDCout is lowered. In response to this, the content in third register 88 storing the difference between the value for voltage VDCout and the value for voltage VDCref both subjected to A/D conversion is turned to a negative value. Then, under the control of logic circuit 142, the value in third register 88 is transferred to register 146. In this manner, the number of P-channel MOS transistors that operate in driving circuit 166 in FIG. 9 is increased, and they serve to suppress lowering of the voltage.

If the current drivability of VDC circuit 141 is to be modified after the values held in first register 84, second register 86 and third register 88 are read from the outside of semiconductor integrated circuit 140, a numerical value indicating a difference between the number of P-channel MOS transistors to be operated and a standard number of operating P-channel MOS transistors in driving circuit 166 is written into third register 88 from the outside. Thus, the value in third register 88 is transferred to register 146 of the VDC circuit by logic circuit 142, and the current drivability of the VDC circuit can be modified.

In Embodiment 7, the values in first register 84, second register 86 and third register 88 are read to the outside of semiconductor integrated circuit 140 so as to externally determine a necessary operating current suitable for operational conditions, and a difference from the present current drivability of voltage conversion circuit 148 is written into register 146. In this manner, the current drivability of voltage conversion circuit 148 can be modified. Thus, semiconductor integrated circuit 140 can attain an operation with larger margin.

In addition, in an initial operation such as power-on of semiconductor integrated circuit 140, a control device capable of executing a boot program or the like for setting register 146 is arranged outside semiconductor integrated circuit 140. In this manner, the current drivability of VDC circuit 141 can be adjusted each time of use, and power consumption can be optimized.

Moreover, even during the operation of semiconductor integrated circuit 140, the contents in first register 84, second register 86 and third register 88 can be updated by means of an external control circuit, and the content in third register 88 is transferred to register 146. Thus, the current drivability of VDC circuit 141 can dynamically be modified.

[Embodiment 8]

Figure 10:
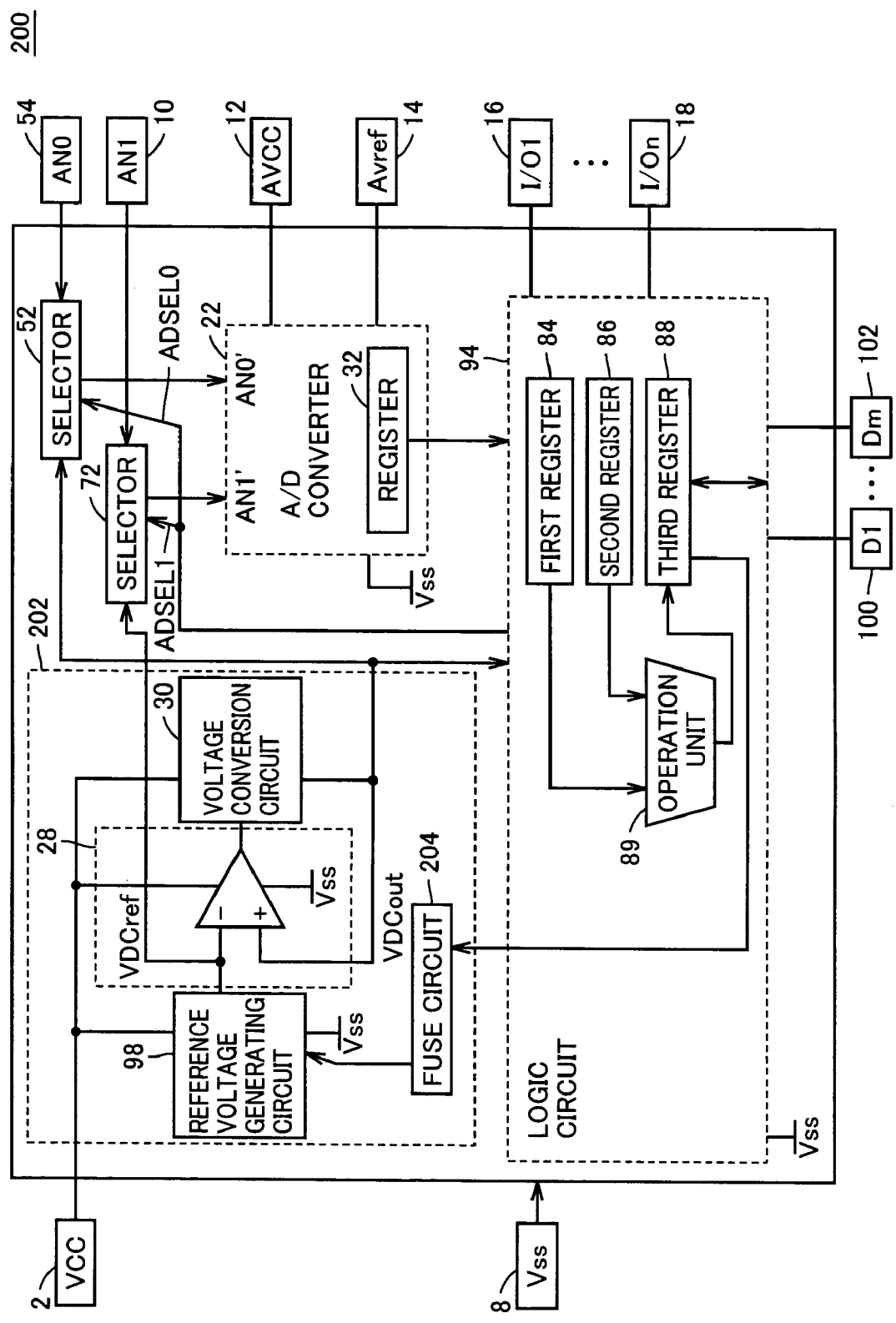
FIG. 10 is a block diagram showing a configuration of a semiconductor integrated circuit 200 in Embodiment 8.

FIG. 10 is a block diagram showing a configuration of a semiconductor integrated circuit 200 in Embodiment 8.

Referring to FIG. 10, semiconductor integrated circuit 200 has a VDC circuit 202, A/D converter 22, logic circuit 94, and selectors 52, 72 integrated on one semiconductor chip. Each circuit has a dedicated input/output terminal. Designation and function of the input signal of each circuit and the power supply are the same as in Embodiment 6, and description thereof will not be repeated.

VDC circuit 202 includes a fuse circuit 204 instead of register 96 in the configuration of VDC circuit 92 in FIG. 6. In other words, VDC circuit 202 includes reference voltage generating circuit 98, differential amplifier 28, voltage conversion circuit 30, and fuse circuit 204. Reference voltage generating circuit 98 generates reference voltage VDCref serving as the reference of voltage VDCout which is the output of VDC circuit 202. Differential amplifier 28 receives voltage VDCref and voltage VDCout as inputs. Differential amplifier 28 outputs a control signal to voltage conversion circuit 30 so as to raise voltage VDCout, if voltage VDCout is lower than voltage VDCref.

On the other hand, differential amplifier 28 outputs a control signal to voltage conversion circuit 30 so as not to raise voltage VDCout, if voltage VDCout is higher than voltage VDCref. Upon receiving the control signal from differential amplifier 28, voltage conversion circuit 30 generates a prescribed voltage VDCout lower than power supply voltage VCC from the same.

An operation of A/D converter 22 can be set by a signal from logic circuit 94. A/D converter 22 subjects analog signals input from input nodes AN0', AN1' to A/D conversion, and a conversion result is stored in register 32 as a digital value.

Logic circuit 94 outputs signals ADSEL0, ADSEL1 for selecting inputs of selectors 52, 72. Logic circuit 94 can also read the value in register 32 in A/D converter 22.

Logic circuit 94 includes first register 84, second register 86, third register 88, and operation unit 89. Logic circuit 94 can store in third register 88, a result obtained by subtracting a value in second register 86 from a value in first register 84 by means of operation unit 89.

Reference voltage generating circuit 98 can provide an output voltage serving as the reference, one voltage or a plurality of voltages higher than the output voltage, and one voltage or a plurality of voltages lower than the output voltage. These voltages can be selected by the setting of a fuse in fuse circuit 204. Though fuse circuit 204 is arranged in VDC circuit 202 in FIG. 10, fuse circuit 204 may be arranged in logic circuit 94 or in another area.

Figure 11:
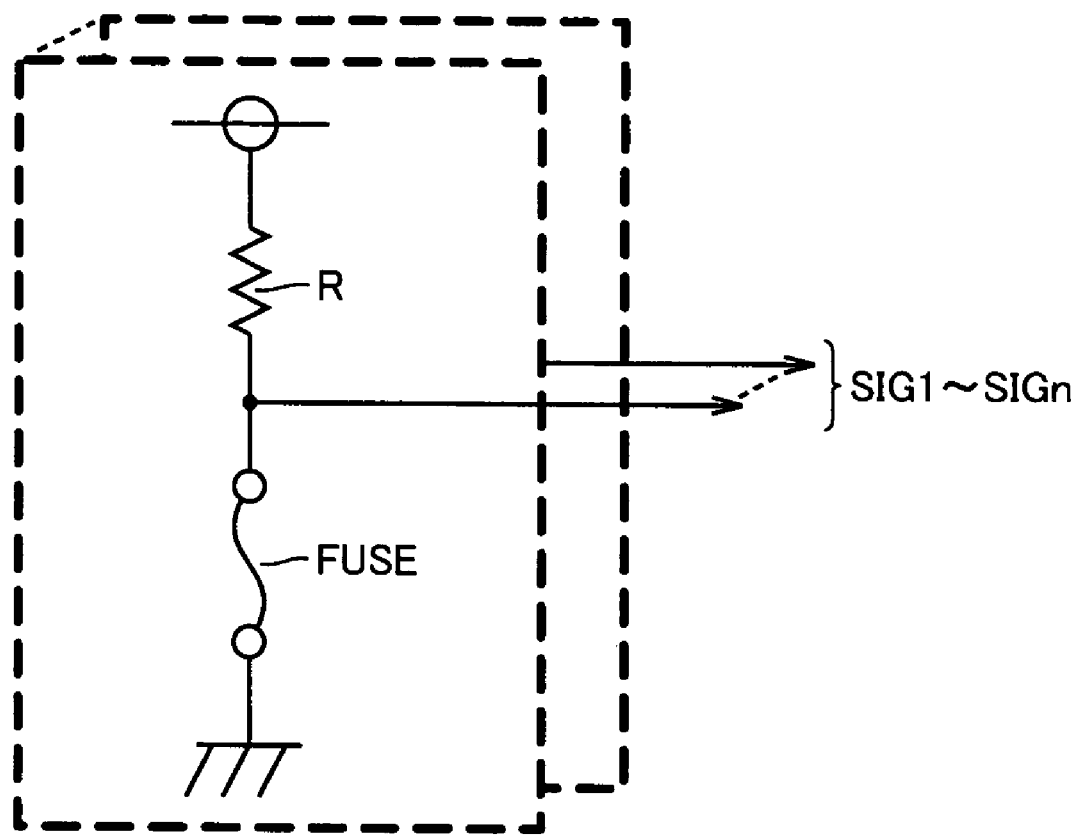
FIG. 11 shows a configuration example of a fuse circuit 204.

FIG. 11 shows a configuration example of fuse circuit 204.

Referring to FIG. 11, fuse circuit 204 includes a plurality of units constituted of a resistor R and a fuse element FUSE connected in series between the power supply node and the ground node. The plurality of units output control signals SIG1 to SIGn respectively. In each unit, a connection node of resistor R and fuse element FUSE outputs a corresponding control signal. When fuse element FUSE is blown and a non-conductive state is established, the control signal attains H level. On the other hand, if the fuse element maintains the present state, the control signal attains L level.

Here, positions of the resistor and the fuse element may be reversed, and the fuse element may be a fuse like an anti-fuse which establishes a conductive state at opposing ends after it is blown.

Referring back to FIG. 10 an overall operation of semiconductor integrated circuit 200 will now be described.

In accordance with signal ADSEL0 from logic circuit 94, selector 52 selects voltage VDCout output by voltage conversion circuit 30. Selector 72 selects reference voltage VDCref in accordance with signal ADSEL1 output by logic circuit 94.

Voltage VDCout is subjected to A/D conversion by A/D converter 22, and a conversion result is stored in register 32. The value in register 32 is read by logic circuit 94, and the read value is stored in first register 84.

In addition, reference voltage VDCref is subjected to A/D conversion by A/D converter 22, and an A/D conversion result is stored in register 32. The value in register 32 is read by logic circuit 94, and the read value is stored in second register 86. Referring to the values in first register 84 and second register 86, operation unit 89 in logic circuit 94 calculates a difference between those two values (the value in the first register—the value in the second register), and a resultant value can be stored in third register 88.

The contents in first register 84, second register 86 and third register 88 within logic circuit 94 can be read as data D1 to Dm via terminals 100 to 102 from the outside of semiconductor integrated circuit 200.

If it is determined that reference voltage VDCref should be modified after the values in first register 84, second register 86 and third register 88 are read from the outside of semiconductor integrated circuit 200, a numerical value indicating a difference from the current reference voltage is externally written into third register 88. Then, the content in third register 88 is written as the setting for the fuse in fuse circuit 204 by logic circuit 94, thereby modifying the output voltage of reference voltage generating circuit 98.

In Embodiment 8, the values in first register 84, second register 86 and third register 88 can be read from the outside of semiconductor integrated circuit 200, and the reference voltage suitable for operational conditions can be determined. By writing the difference from the current reference voltage in accordance with a determination result as the setting for the fuse in fuse circuit 204 of VDC circuit 202, reference voltage VDCref can be modified to a voltage suitable for a condition of use of semiconductor integrated circuit 200. By writing an optimal value into the fuse, the reference voltage permanently modified to the optimal value can be generated during use.

In addition, the values stored in the first to third registers are read in the shipment test, and an appropriate value determined from each voltage value is calculated. Thereafter, the reference voltage modification value is written into the fuse. In this manner, a semiconductor integrated circuit of which reference voltage has permanently been regulated can be shipped.

[Embodiment 9]

Figure 12:
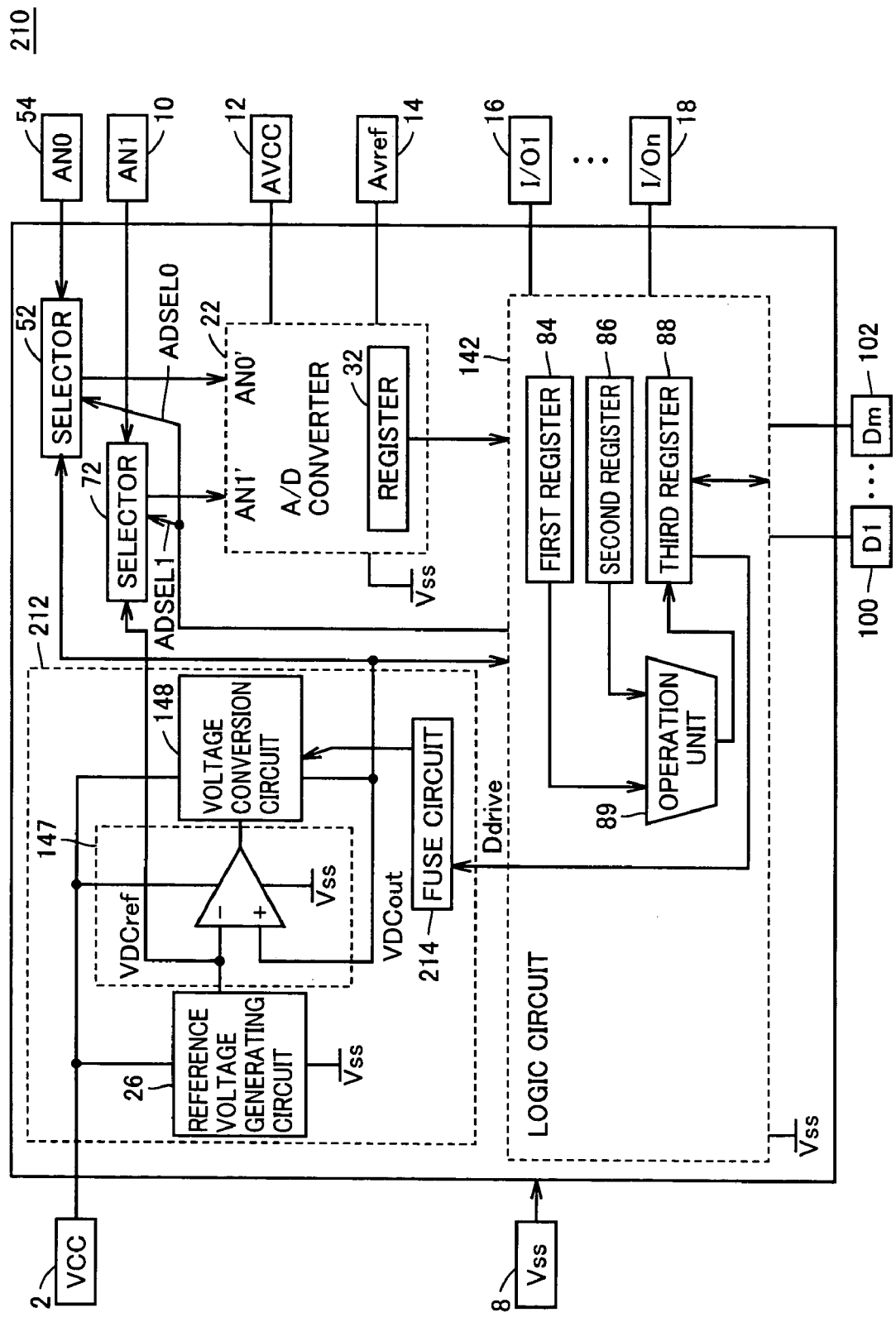
FIG. 12 is a block diagram showing a configuration of a semiconductor integrated circuit 210 in Embodiment 9.

FIG. 12 is a block diagram showing a configuration of a semiconductor integrated circuit 210 in Embodiment 9.

Referring to FIG. 12, semiconductor integrated circuit 210 has a VDC circuit 212, A/D converter 22, logic circuit 142, and selectors 52, 72 integrated on one semiconductor chip. Each circuit has a dedicated input/output terminal. Designation and function of the input signal of each circuit and the power supply are the same as in Embodiment 7, and description thereof will not be repeated.

VDC circuit 212 includes reference voltage generating circuit 26, differential amplifier 147, and voltage conversion circuit 148. Reference voltage generating circuit 26 generates reference voltage VDCref serving as the reference of voltage VDCout which is the output of VDC circuit 212. Differential amplifier 147 receives voltage VDCref and voltage VDCout as inputs. Differential amplifier 147 outputs a control signal to voltage conversion circuit 148 so as to raise voltage VDCout, if voltage VDCout is lower than voltage VDCref On the other hand, differential amplifier 147 outputs a control signal to voltage conversion circuit 148 so as not to raise voltage VDCout, if voltage VDCout is higher than voltage VDCref Upon receiving the control signal from differential amplifier 147, voltage conversion circuit 148 generates a prescribed voltage VDCout lower than power supply voltage VCC from the same.

An operation of A/D converter 22 can be set by a signal from logic circuit 142. A/D converter 22 subjects analog signals input from input nodes AN0', AN1' to A/D conversion, and a conversion result is stored in register 32 as a digital value.

Logic circuit 142 outputs signals ADSEL0, ADSEL1 for selecting inputs of selectors 52, 72. Logic circuit 142 can also read the value in register 32 in A/D converter 22.

Logic circuit 142 includes first register 84, second register 86, third register 88, and operation unit 89. Logic circuit 142 can store in third register 88, a result obtained by subtracting a value in second register 86 from a value in first register 84 by means of operation unit 89.

VDC circuit 212 includes a fuse circuit 214 instead of register 146 in the configuration of VDC circuit 141 in FIG. 8. The configuration of VDC circuit 212 is otherwise the same as that of VDC circuit 141.

Voltage conversion circuit 148 in VDC circuit 212 includes a plurality of current driving transistors. Normally, a prescribed number of current driving transistors operate. The number of current driving transistors that operate can be varied in accordance with the setting of the fuse in fuse circuit 214. Voltage conversion circuit 148 operates in such a manner that the number of driving transistors increases when the value set by the fuse is negative, while the number of driving transistors decreases when the value set by the fuse is positive. Though fuse circuit 214 is arranged in VDC circuit 212 in FIG. 12, fuse circuit 214 may be arranged in logic circuit 142 or in another area.

Under the control of logic circuit 142, the value in third register 88 can be written in fuse circuit 214.

Referring back to FIG. 12, an overall operation of semiconductor integrated circuit 210 will now be described.

In accordance with signal ADSEL0 from logic circuit 142, selector 52 selects voltage VDCout output by voltage conversion circuit 148. Selector 72 selects reference voltage VDCref in accordance with signal ADSEL1 output by logic circuit 142.

Voltage VDCout is subjected to A/D conversion by A/D converter 22, and a conversion result is stored in register 32. The value in register 32 is read by logic circuit 142, and the read value is stored in first register 84.

In addition, reference voltage VDCref is subjected to A/D conversion by A/D converter 22, and an A/D conversion result is stored in register 32. The value in register 32 is read by logic circuit 142, and the read value is stored in second register 86. Referring to the values in first register 84 and second register 86, operation unit 89 in logic circuit 142 calculates a difference between those values (the value in the first register—the value in the second register), and a resultant value can be stored in third register 88.

The contents in first register 84, second register 86 and third register 88 within logic circuit 142 can be read as data D1 to Dm via terminals 100 to 102 from the outside of semiconductor integrated circuit 210.

As the current consumed by logic circuit 142 becomes large, voltage VDCout is lowered. In response to this, the content in third register 88 storing the difference between the value for voltage VDCout and the value for voltage VDCref both subjected to A/D conversion is turned to a negative value. Then, under the control of logic circuit 142, the value in third register 88 is transferred to register 146. In this manner, the number of P-channel MOS transistors that operate in driving circuit 166 in FIG. 9 is increased, and they serve to suppress lowering of the voltage.

In other words, it is determined whether or not the current drivability of VDC circuit 212 should be modified after the values in first register 84, second register 86 and third register 88 are read from the outside of semiconductor integrated circuit 210. If the modification is necessary, a numerical value indicating a difference from a standard number of operating driving transistors is written into third register 88. Thus, the setting is written in fuse circuit 214 arranged in VDC circuit 212 under the control of logic circuit 142, and the current drivability of the VDC circuit can be modified.

In Embodiment 9, the values in first register 84, second register 86 and third register 88 are read to the outside of semiconductor integrated circuit 210 so as to determine a necessary operating current suitable for operational conditions. A difference from the present current drivability of voltage conversion circuit 148 is written into fuse circuit 214, whereby drivability of voltage conversion circuit 148 suitable for operation can permanently be set. In this manner, the VDC circuit in which power consumption has been optimized can be obtained. In addition, by writing a modification value with respect to the current drivability into the fuse circuit in the shipment test, a semiconductor integrated circuit of which current drivability has permanently been adjusted to an appropriate value can be shipped.

[Embodiment 10]

Figure 13:
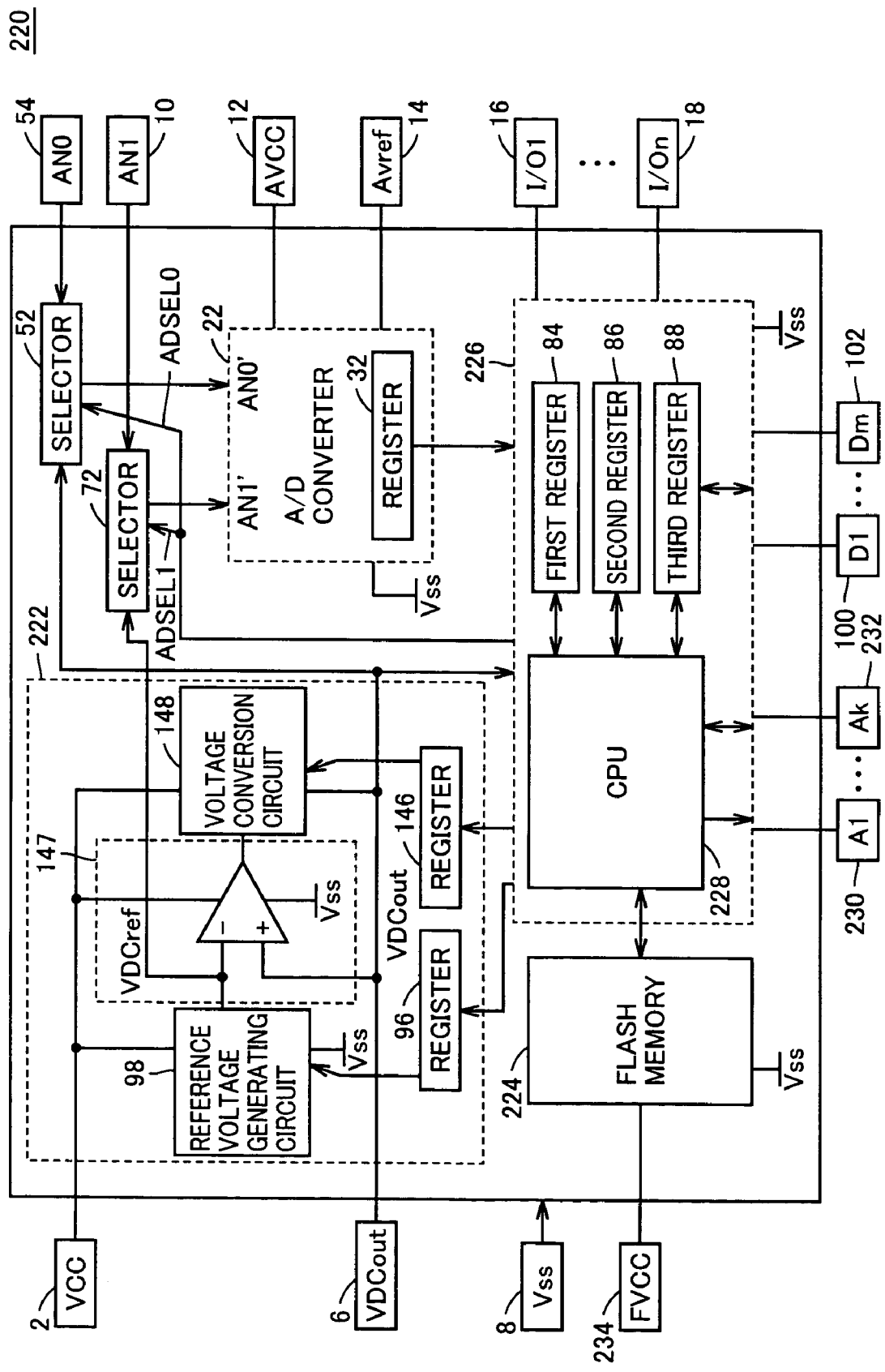
FIG. 13 is a block diagram showing a configuration of a semiconductor integrated circuit 220 in Embodiment 10.

FIG. 13 is a block diagram showing a configuration of a semiconductor integrated circuit 220 in Embodiment 10.

Referring to FIG. 13, semiconductor integrated circuit 220 has a VDC circuit 222, A/D converter 22, a logic circuit 226, and a flash memory 224 integrated on one semiconductor chip. Each circuit has a dedicated input/output terminal.

VDC circuit 222 is supplied with power supply voltage VCC, while the A/D converter is supplied with power supply voltage AVCC. Logic circuit 226 is supplied with voltage VDCout which is the output of VDC circuit 222 as an operation power supply voltage. In addition, flash memory 224 is externally supplied with a power supply voltage FVCC. In other words, respective circuit blocks operate by receiving separate operation power supply voltages. Here, ground voltage VSS, that is, ground is common for each block.

VDC circuit 222 includes reference voltage generating circuit 98, differential amplifier 147, voltage conversion-circuit 148, and registers 96 and 146. VDC circuit 222 receives power supply voltage VCC from the outside, and outputs reference voltage VDCref which is the output of reference voltage generating circuit 98 and voltage VDCout which is the output of voltage conversion circuit 148.

A/D converter 22 receives power supply voltage AVCC as the operation power supply voltage. A/D converter 22 receives reference voltage Avref for A/D conversion via terminal 14.

Selector 52 selects one of analog signal AN0 and voltage VDCout in accordance with signal ADSEL0 provided from logic circuit 226, and provides the selected one to input node AN0' of A/D converter 22. Selector 72 selects one of reference voltage VDCref and analog signal AN1 in accordance with signal ADSEL1, and provides the selected one to input node AN1' of A/D converter 22.

Logic circuit 226 includes a CPU 228, first register 84, second register 86, and third register 88. Logic circuit 226 inputs/outputs signals I/O1 to I/On which are control signals or data signals via n terminals 16–18 to/from the outside of semiconductor integrated circuit 220. In addition, logic circuit 226 provides/receives as data D1 to Dm via m terminals 100 to 102, data in the register or the data read/written by CPU 228. Logic circuit 226 outputs address values A1 to Ak output by CPU 228 via terminals 230 to 232.

Reference voltage generating circuit 98 generates reference voltage VDCref serving as the reference of voltage VDCout of VDC circuit 222. Differential amplifier 147 receives and compares voltage VDCref and voltage VDCout.

Differential amplifier 147 transmits a control signal to voltage conversion circuit 148 so as to raise voltage VDCout, if voltage VDCout is lower than voltage VDCref On the other hand, differential amplifier 147 transmits a control signal to voltage conversion circuit 148 so as not to raise voltage VDCout, if voltage VDCout is higher than voltage VDCref In response to the control signal from differential amplifier 147, voltage conversion circuit 148 generates a prescribed voltage VDCout lower than power supply voltage VCC from the same.

An operation of A/D converter 22 can be set by a signal from logic circuit 226. A/D converter 22 subjects analog signals input from input nodes AN0', AN1'to A/D conversion, and a conversion result is stored in register 32 as a digital value.

Logic circuit 226 outputs signals ADSEL0, ADSEL1 for selecting inputs of selectors 52, 72. Logic circuit 226 can also read the value in register 32 in A/D converter 22. In addition, logic circuit 226 can store in third register 88, a result obtained by subtracting a value for reference voltage VDCref held in the second register from a value for voltage VDCout held in first register 84. This operation can be performed by utilizing a subtraction function of CPU 228.

As the configuration of reference voltage generating circuit 98 and voltage conversion circuit 148 has been described in connection with FIGS. 7 and 9, description thereof will not be repeated.

Voltage conversion circuit 148 includes a plurality of driving transistors. Normally, a prescribed number of driving transistors operate. The number of driving transistors that operate can be varied in accordance with the value in register 146. Voltage conversion circuit 148 operates in such a manner that the number of driving transistors increases when the value in register 146 is negative, while the number of driving transistors decreases when the value in register 146 is positive. Here, register 146 may store the number of current driving transistors that operate, and voltage conversion circuit 148 may be configured such that the transistors in the number designated by register 146 operate.

Though register 146 is arranged in VDC circuit 222 in FIG. 13, register 146 may be arranged in logic circuit 226 or in another area. In addition, the value stored in register 146 can be read and written by the logic circuit containing CPU 228.

Reference voltage generating circuit 98 can provide an output voltage serving as the reference, one voltage or a plurality of voltages higher than the output voltage, and one voltage or a plurality of voltages lower than the output voltage. These voltages can be selected in accordance with the value in register 96. Though register 96 is arranged in VDC circuit 222 in FIG. 13, register 96 may be arranged in logic circuit 226 or in another area.

An operation of semiconductor integrated circuit 220 will now be described.

In flash memory 224, an instruction string executed by CPU 228 and data used when the instruction is executed are provided. An instruction string for the CPU (program) for executing the operation in Embodiment 10 and a parameter (data) used for such an instruction are also stored in flash memory 224. When a user requests start-up of that program from other programs, or at power-on or reset of semiconductor integrated circuit 220, that program stored in flash memory 224 can be executed.

Figure 14:
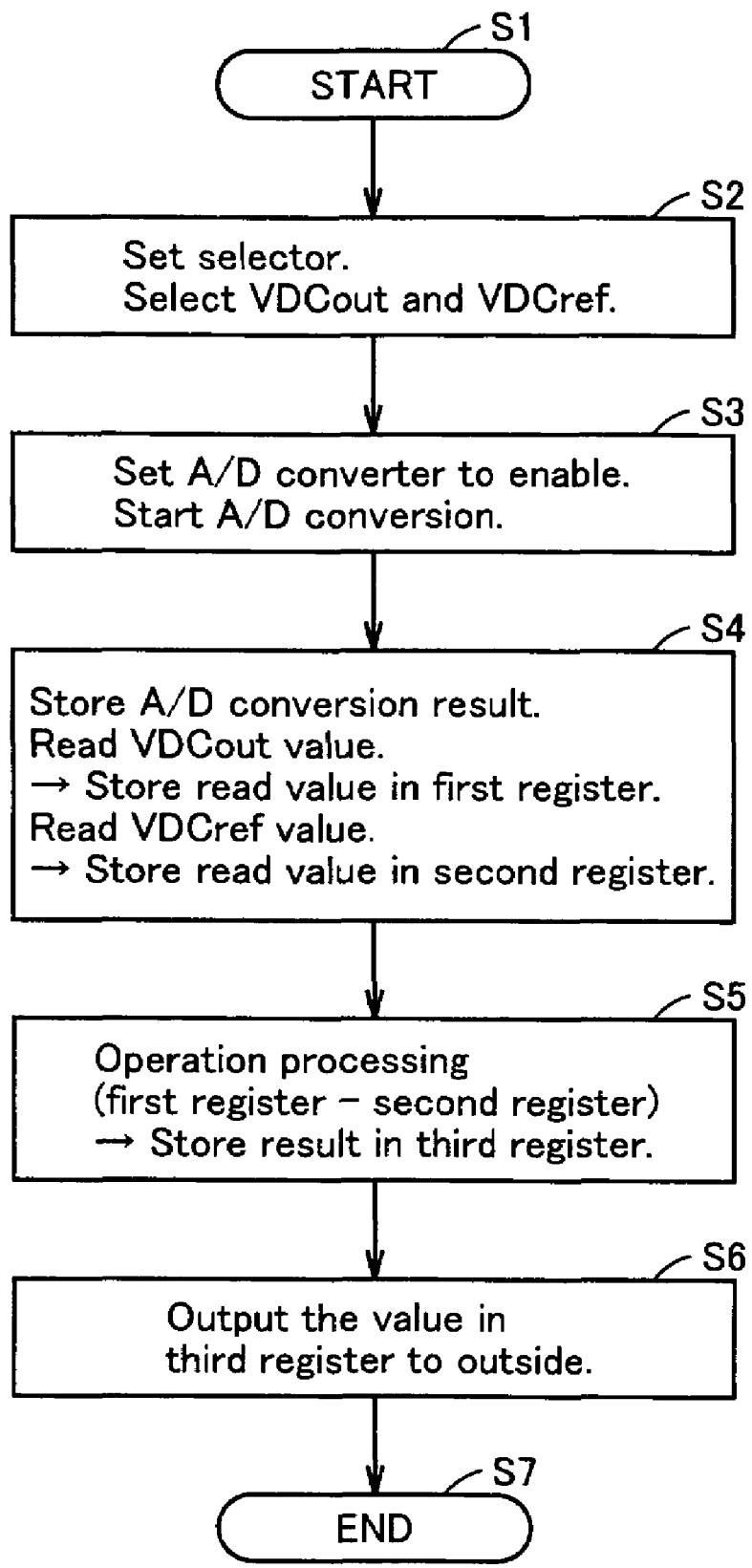
FIG. 14 is a flowchart illustrating a first processing performed by a CPU.

FIG. 14 is a flowchart illustrating a first processing performed by a CPU.

Referring to FIG. 14, the processing starts at step S1, and the selector is set at step S2. Selector 52 selects voltage VDCout output by voltage conversion circuit 148. Selector 72 selects voltage VDCref output by reference voltage generating circuit 98. CPU 228 controls signals ADSEL0, ADSEL1 so as to perform such selection.

In succession, at step S3, A/D converter 22 is set to enable. Then, A/D converter 22 initially subjects voltage VDCout to A/D conversion, and a conversion result is stored in register 32. The conversion result is read from register 32 by CPU 228 and stored in first register 84. Moreover, voltage VDCref is subjected to A/D conversion by the A/D converter, and stored in register. The conversion result of voltage VDCref is read by CPU 228 and stored in second register 86 (step S4).

Thereafter, an operation processing is performed at step S5. That is, regarding the values in first register 84 and second register 86 as inputs, the CPU causes third register 88 to store a difference between these values (the value in the first register—the value in the second register).

Then, in step S6, the contents in the first register to the third register can be output as data D1 to Dm via terminals 100 to 102 to the outside of semiconductor integrated circuit 220 in response to a transfer instruction executed by CPU 228.

Figure 15:
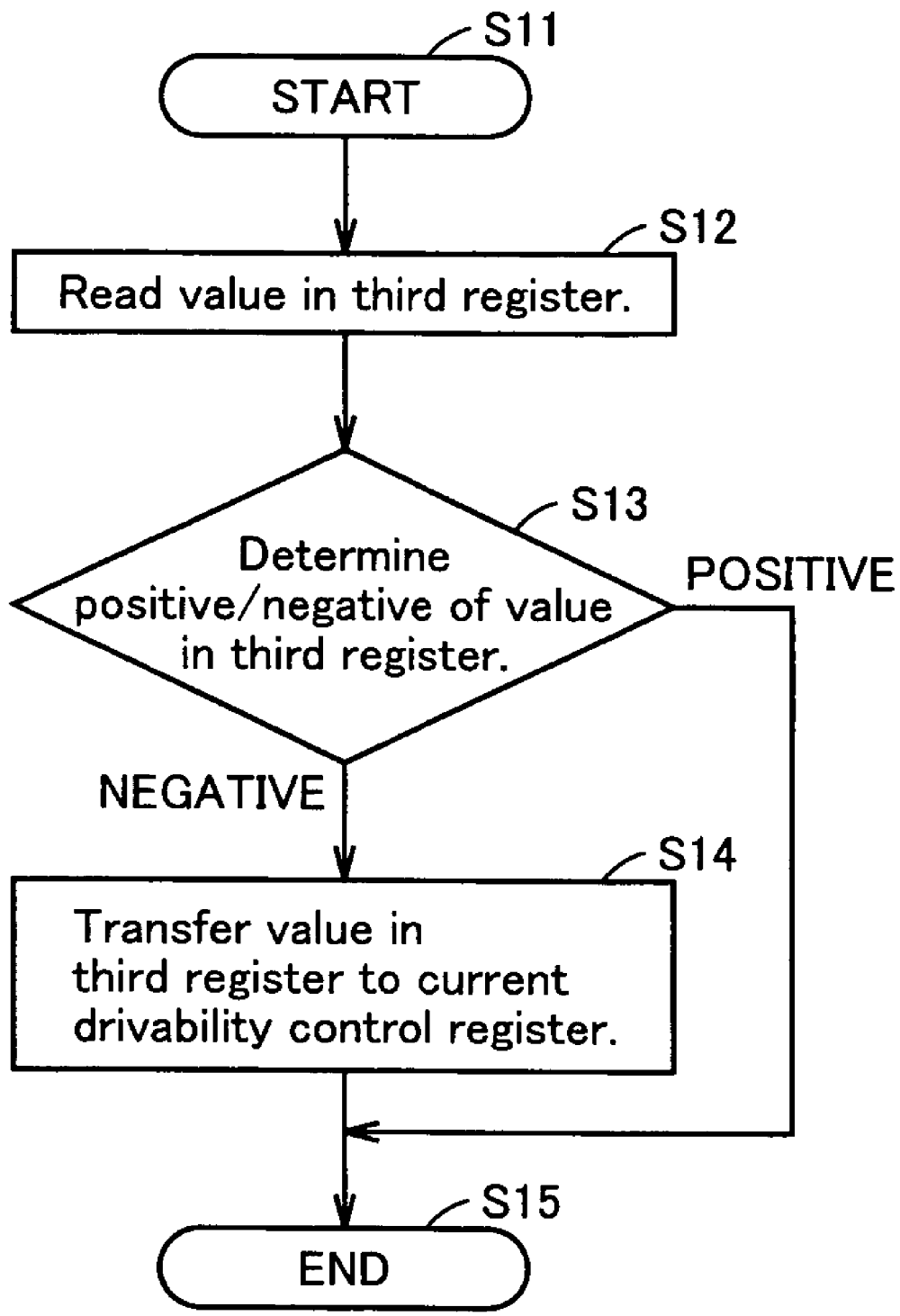
FIG. 15 is a flowchart illustrating a second processing performed by a CPU 228.

FIG. 15 is a flowchart illustrating a second processing performed by CPU 228.

With reference to FIG. 15, voltage modification when the current consumed in logic circuit 226 containing the CPU becomes large and voltage VDCout is lowered will be described. When voltage VDCout is lowered, the content in third register 88 storing the difference between voltage VDCout and voltage VDCref both subjected to A/D conversion is turned to a negative value.

The processing starts at step S11, and the value in third register 88 is read at step S12. Then, whether the value in the third register is positive or negative is determined at step S13.

When the value in the third register is negative, the process proceeds to step S14, and the value in third register 88 is transferred to a register for controlling current drivability by CPU 228. In this manner, as the number of driving transistors in voltage conversion circuit 148 increases, voltage conversion circuit 148 serves to suppress lowering of the voltage.

On the other hand, when the value in the third register is determined as positive at step S13, the process proceeds to step S15 without performing step S14, and the process ends.

In addition, whether or not voltage VDCref and voltage VDCout are appropriate may be determined by comparing a target voltage value (maximum value, minimum value) stored in flash memory 224 with the voltage. A determination result may be output as data D1 to Dm from terminal 100 to 102 via a data bus, or alternatively, it may be notified to the outside of semiconductor integrated circuit 220 as signals I/O1 to I/On via input/output terminals 16 to 18.

Figure 16:
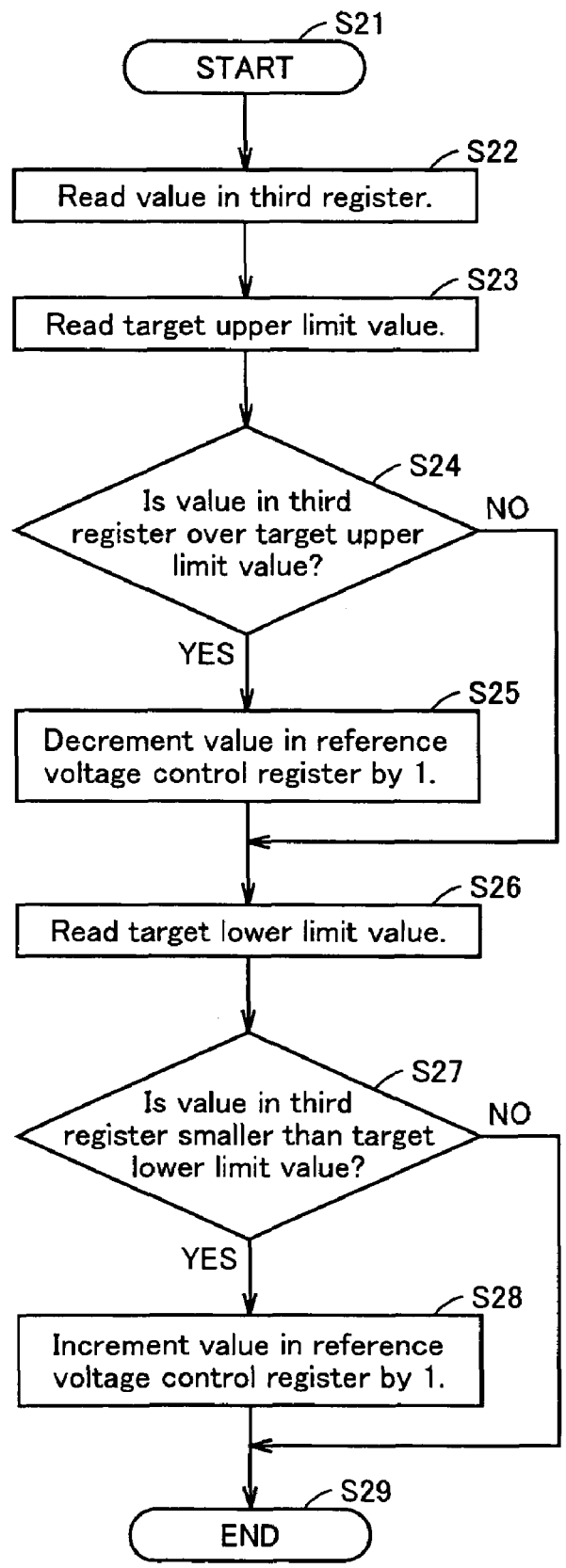
FIG. 16 is a flowchart illustrating a third processing performed by a CPU.

FIG. 16 is a flowchart illustrating a third processing performed by the CPU.

Referring to FIG. 16, an example in which CPU 228 modifies voltage VDCout will be described.

When the processing starts at step S21, CPU 228 reads the value in third register 88 at step S22. Then, CPU 228 reads an upper limit value of the target stored in flash memory 224 at step S23.

Thereafter in step S24, CPU 228 determines whether or not the value in third register 88 exceeds the target upper limit value. If CPU 228 determines that the value in third register 88 exceeds the target upper limit value, CPU 228 decrements the value in register 96 by 1 at step S25, and instructs reference voltage generating circuit 98 to lower voltage VDCref. If the value in third register 88 does not exceed the target upper limit value at step S24, the process proceeds to step S26 without performing step S25.

At step S26, a target lower limit value stored in flash memory 224 is read. At step S27, whether or not the value in the third register is smaller than the target lower limit value is determined. If the value in the third register is smaller than the target lower limit value, the process proceeds to step S28, where the value in register 96 for controlling the reference voltage is incremented by 1.

On the other hand, if the value in the third register is not smaller than the target lower limit value, the process proceeds to step S29 without performing step S28, and the process ends. In this manner, the values held in first register 84, second register 86 and third register 88 are read by the operation of the CPU and compared with the target value stored in flash memory 224. Then, a modification value in accordance with the comparison result is written in register 96, whereby voltage VDCref can be modified. As to the modification result, whether the modification is successful or not can be checked by observing a value obtained by subjecting voltage VDCout to A/D conversion. For example, when an operation voltage should be raised in order to increase a maximum operation speed of the logic circuit containing the CPU, the reference voltage is raised. On the other hand, when the current consumed in the logic circuit containing the CPU is to be lowered, the reference voltage is lowered.

As described above, in Embodiment 10, the CPU is provided in the logic circuit, and a program and data for the CPU are stored in the flash memory. In this manner, control of voltage VDCref and voltage VDCout can readily be performed by control the program. Specifically, lowering of the voltage during operation of the logic circuit containing the CPU is detected, and the current drivability of the VDC circuit can be modified or the operation voltage can be modified as required. In addition, by rewriting a control program of the flash memory and the data used by the program, control of the VDC circuit in accordance with an application can be performed for each individual semiconductor integrated circuit.

[Embodiment 11]

Figure 17:
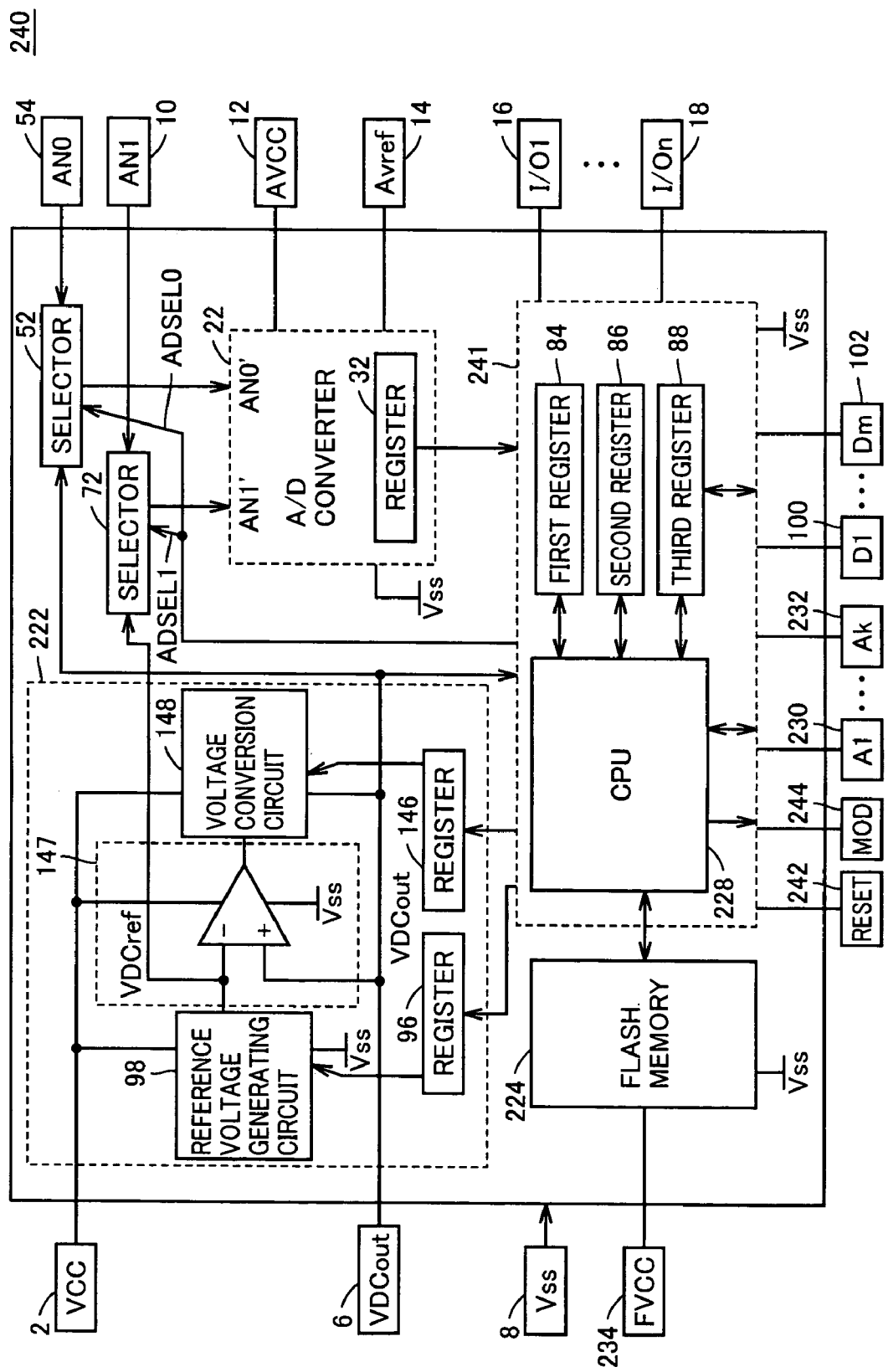
FIG. 17 is a block diagram showing a configuration of a semiconductor integrated circuit 240 in Embodiment 11.

FIG. 17 is a block diagram showing a configuration of a semiconductor integrated circuit 240 in Embodiment 11.

Referring to FIG. 17, semiconductor integrated circuit 240 includes a terminal 242 for input of a reset signal and a terminal 244 for input of a mode signal, in addition to the configuration of semiconductor integrated circuit 220 shown in FIG. 13.

When a mode signal MOD provided to terminal 244 is activated simultaneously with a reset signal RESET input to terminal 242 at power-on, a prescribed program stored in the flash memory described in Embodiment 10 is operated. Then, semiconductor integrated circuit 240 can subject voltage VDCref and voltage VDCout to A/D conversion, and provide a resultant value as data D1 to Dm as a digital value to the outside of the semiconductor integrated circuit. As the configuration and operation are otherwise the same as in Embodiment 10, description thereof will not be repeated.

The value converted to the digital value is compared with the target setting value stored in the flash memory, whereby the values in registers 96, 146 are varied, so as to modify the current drivability of the VDC circuit or to modify reference voltage VDCref of the VDC circuit.

Though it has been assumed that mode signal MOD is recognized when it is activated simultaneously with reset signal RESET in Embodiment 11, solely mode signal MOD may be activated for recognition by the CPU.

In addition, a plurality of terminals for input of the mode signal may be provided and separate terminals may be associated with operations as shown in the flowcharts in FIGS. 14 to 16 so that limited operation is performed. For example, two mode terminals are provided and signals MOD1, MOD2 are provided. If signal MOD 1 is activated, register 146 may be modified so as to modify the current drivability of the VDC circuit. On the other hand, if signal MOD 2 is activated, the value in register 96 may be modified so as to modify the reference voltage.

As described above, in Embodiment 11, the current drivability of the VDC circuit and reference voltage VDCref can be modified at reset by providing a mode terminal. In addition, if it is configured that the mode terminal is activated regardless of reset, the current drivability of the VDC circuit and reference voltage VDCref can be modified immediately after the mode terminal is activated from hardware provided outside semiconductor integrated circuit 240.

[Embodiment 12]

Figure 18:
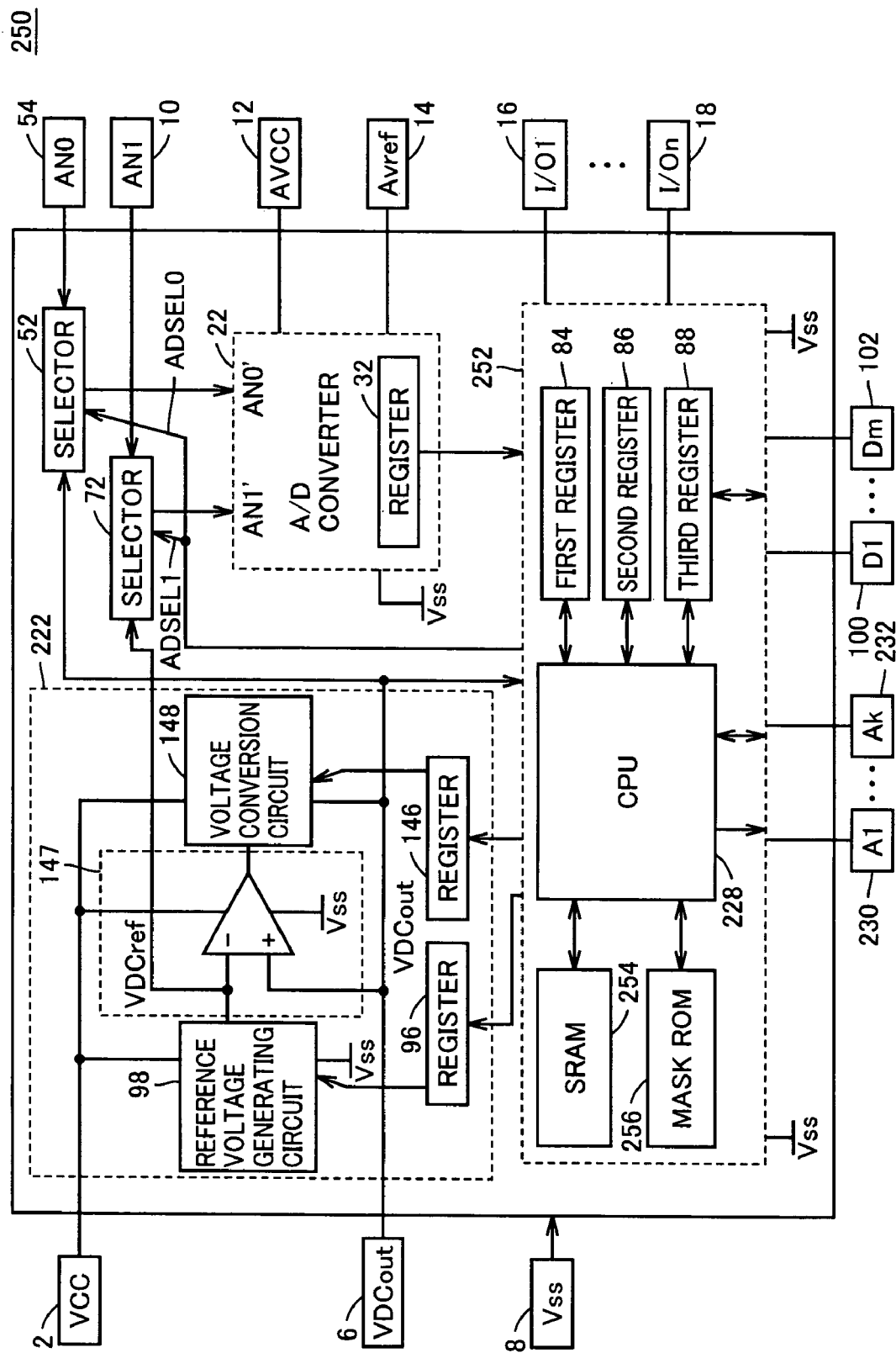
FIG. 18 is a block diagram showing a configuration of a semiconductor integrated circuit 250 in Embodiment 12.

FIG. 18 is a block diagram showing a configuration of a semiconductor integrated circuit 250 in Embodiment 12.

Referring to FIG. 18, semiconductor integrated circuit 250 has VDC circuit 222, A/D converter 22, a logic circuit 252, and selectors 52, 72 integrated on one semiconductor chip. Each circuit has a dedicated input/output terminal. VDC circuit 222 includes reference voltage generating circuit 98, differential amplifier 147, voltage conversion circuit 148, and registers 96 and 146.

A/D converter 22 includes register 32 storing an A/D conversion result.

Logic circuit 252 includes CPU 228, an SRAM 254, a mask ROM 256, first register 84, second register 86, and third register 88.

Here, the power supply will be described. VDC circuit 222 receives power supply voltage VCC via terminal 2, while A/D converter 22 receives power supply voltage AVCC via terminal 12. Logic circuit 252 containing CPU 228 receives voltage VDCout which is the output of VDC circuit 222 as the power supply voltage. In other words, respective circuit blocks operate by receiving separate power supply voltages. Here, ground voltage VSS, that is, ground is common for each block.

VDC circuit 222 includes reference voltage generating circuit 98, differential amplifier 147, voltage conversion circuit 148, and registers 96 and 146. VDC circuit 222 receives power supply voltage VCC from the outside, and outputs reference voltage VDCref which is the output of reference voltage generating circuit 98 and voltage VDCout which is the output of voltage conversion circuit 148.

A/D converter 22 receives power supply voltage AVCC as the operation power supply voltage. A/D converter 22 receives reference voltage Avref for A/D conversion via terminal 14.

Selector 52 selects one of analog signal AN0 and voltage VDCout in accordance with signal ADSEL0 provided from logic circuit 252, and provides the selected one to input node AN0' of A/D converter 22. Selector 72 selects one of reference voltage VDCref and analog signal AN1 in accordance with signal ADSEL1, and provides the selected one to input node AN1' of A/D converter 22.

Logic circuit 252 includes CPU 228, first register 84, second register 86, third register 88, SRAM 254, and the mask ROM. Logic circuit 252 inputs/outputs signals I/O1 to I/On which are control signals or data signals via n terminals 16–18 to/from the outside of semiconductor integrated circuit 250. In addition, logic circuit 252 provides/receives as data D1 to Dm via m terminals 100 to 102, data in the register or the data read/written by CPU 228. Logic circuit 252 outputs address values A1 to Ak output by CPU 228 via terminals 230 to 232.

Reference voltage generating circuit 98 generates reference voltage VDCref serving as the reference of output voltage VDCout of VDC circuit 222. Differential amplifier 147 receives and compares voltage VDCref and voltage VDCout.

Differential amplifier 147 transmits a control signal to voltage conversion circuit 148 so as to raise voltage VDCout, if voltage VDCout is lower than voltage VDCref. On the other hand, differential amplifier 147 transmits a control signal to voltage conversion circuit 148 so as not to raise voltage VDCout, if voltage VDCout is higher than voltage VDCref.

In response to the control signal from differential amplifier 147, voltage conversion circuit 148 generates a prescribed voltage VDCout lower than power supply voltage VCC from the same.

An operation of A/D converter 22 can be set by a signal from logic circuit 252. A/D converter 22 subjects analog signals input from input nodes AN0', AN1'to A/D conversion, and a conversion result is stored in register 32 as a digital value.

Logic circuit 252 outputs signals ADSEL0, ADSEL1 for selecting inputs of selectors 52, 72. Logic circuit 252 can also read the value in register 32 in A/D converter 22. In addition, logic circuit 252 can store in third register 88, a result obtained by subtracting a value for reference voltage VDCref held in the second register from a value for voltage VDCout held in first register 84. This operation can be performed by utilizing a subtraction function of CPU 228.

As the configuration of reference voltage generating circuit 98 and voltage conversion circuit 148 has been described in connection with FIGS. 7 and 9, description thereof will not be repeated.

Voltage conversion circuit 148 includes a plurality of driving transistors. Normally, a prescribed number of driving transistors operate. The number of driving transistors that operate can be varied in accordance with the value in register 146. Voltage conversion circuit 148 operates in such a manner that the number of driving transistors increases when the value in register 146 is negative, while the number of driving transistors decreases when the value in register 146 is positive. Here, register 146 may store the number of current driving transistors that operate, and voltage conversion circuit 148 may be configured such that the transistors in the number designated by register 146 operate.

Though register 146 is arranged in VDC circuit 222 in FIG. 18, register 146 may be arranged in logic circuit 252 or in another area. In addition, the value stored in register 146 can be read and written by logic circuit 252 containing CPU 228.

Reference voltage generating circuit 98 can provide an output voltage serving as the reference, one voltage or a plurality of voltages higher than the output voltage, and one voltage or a plurality of voltages lower than the output voltage. These voltages can be selected in accordance with the value in register 96. Though register 96 is arranged in VDC circuit 222 in FIG. 18, register 96 may be arranged in logic circuit 252 or in another area.

An overall operation of semiconductor integrated circuit 250 according to the present invention will now be described.

An instruction string executed by CPU 228 and data used when the instruction is executed are stored in a memory device (not shown) such as an EEPROM arranged outside semiconductor integrated circuit 250.

In mask ROM 256, a program (boot program) for loading the instruction string and the data in the memory device to SRAM 254 and transferring the operation of CPU 228 to the loaded program is stored.

The boot program operates at reset of semiconductor integrated circuit 250 or when another program in the mask ROM requests start-up of the boot program. In the following, an operation by the program booted in SRAM 254 by the boot program at reset will be described.

An operation similar to that described in connection with FIGS. 14 to 16 is performed also in Embodiment 12. In other words, the processing is started and the selector is set. Selector 52 selects voltage VDCout output by voltage conversion circuit 148. Selector 72 selects voltage VDCref output by reference voltage generating circuit 98. CPU 228 controls signals ADSEL0, ADSEL1 so as to perform such selection.

In succession, A/D converter 22 is set to enable. Then, A/D converter 22 initially subjects voltage VDCout to A/D conversion, and a conversion result is stored in register 32. The conversion result is read from register 32 by CPU 228 and stored in first register 84. Moreover, voltage VDCref is subjected to A/D conversion by the A/D converter and stored in register 32. The conversion result of voltage VDCref is read by CPU 228 and stored in second register 86.

Thereafter, the operation processing is performed. That is, regarding the values in first register 84 and second register 86 as inputs, the CPU causes third register 88 to store a difference between these values (the value in the first register—the value in the second register).

Then, the contents in the first register to the third register can be output as data D1 to Dm via terminals 100 to 102 to the outside of semiconductor integrated circuit 250 in response to a transfer instruction executed by CPU 228.

Voltage modification when the current consumed in logic circuit 252 containing the CPU becomes large and voltage VDCout is lowered will now be described. When voltage VDCout is lowered, the content in third register 88 storing the difference between voltage VDCout and voltage VDCref both subjected to A/D conversion is turned to a negative value.

The value in third register 88 is read, and in succession, whether the value in the third register is positive or negative is determined.

When the value in the third register is negative, the value in third register 88 is transferred to a register for controlling current drivability by CPU 228. In this manner, as the number of driving transistors in voltage conversion circuit 148 increases, voltage conversion circuit 148 serves to suppress lowering of the voltage.

On the other hand, when the value in the third register is determined as positive, CPU 228 does not transfer the value in third register 88 to the register, and the process ends.

In addition, by comparing a target voltage value (maximum value, minimum value) stored in the SRAM from the memory device (not shown) such as the EEPROM by booting with the voltage, whether or not voltage VDCref and voltage VDCout are appropriate may be determined. A determination result may be output as data D1 to Dm from terminal 100 to 102 via a data bus, or alternatively, it may be notified to the outside of semiconductor integrated circuit 250 as signals I/O1 to I/On via input/output terminals 16 to 18.

If CPU 228 modifies voltage VDCout, CPU 228 reads the value in third register 88. CPU 228 determines whether or not the value in third register 88 exceeds the target upper limit value. In addition, CPU 228 determines whether or not the value in the third register is smaller than the target lower limit value. In this manner, the values held in first register 84, second register 86 and third register 88 are read by the operation of the CPU and compared with the target value stored in the SRAM from the memory device (not shown) such as the EEPROM by booting. Then, a modification value in accordance with the comparison result is written in register 96, whereby voltage VDCref can be modified. As to the modification result, whether the modification is successful or not can be checked by observing a value obtained by subjecting voltage VDCout to A/D conversion.

For example, when an operation voltage should be raised in order to increase a maximum operation speed of the logic circuit containing the CPU, the reference voltage is raised. On the other hand, when the current consumed in the logic circuit containing the CPU is to be lowered, the reference voltage is lowered.

In Embodiment 12, the current drivability of VDC circuit 222 and reference voltage VDCref can be modified by means of the program loaded to SRAM 254 by the boot program on mask ROM 256. As the flash memory is not arranged on the integrated circuit in Embodiment 12, the number of steps in a wafer process for the semiconductor integrated circuit can be reduced as compared with an example in which the flash memory is mounted. Therefore, manufacturing cost for the semiconductor integrated circuit can be reduced.

[Embodiment 13]

Figure 19:
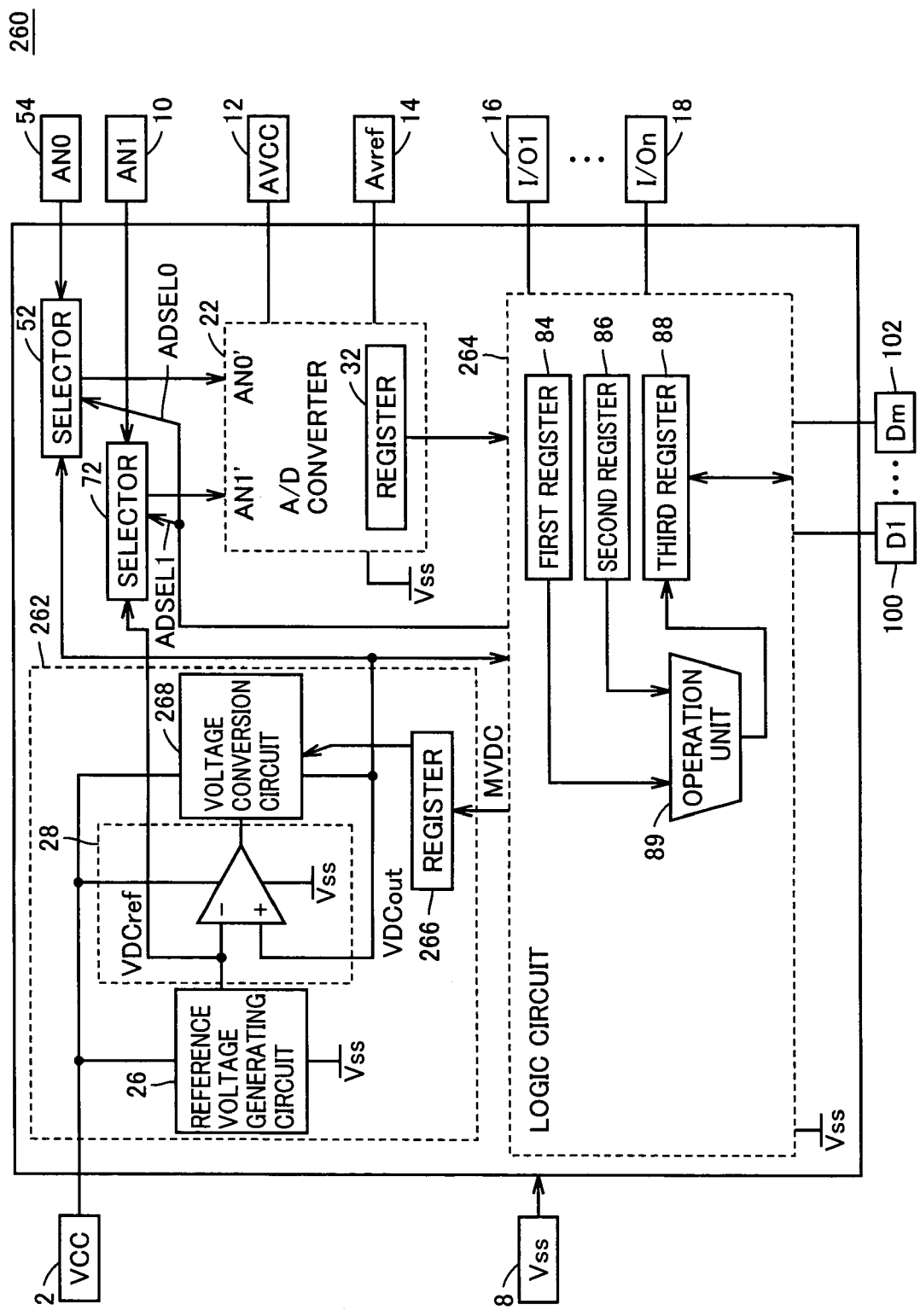
FIG. 19 is a block diagram showing a configuration of a semiconductor integrated circuit 260 in Embodiment 13.

FIG. 19 is a block diagram showing a configuration of a semiconductor integrated circuit 260 in Embodiment 13.

Referring to FIG. 19, semiconductor integrated circuit 260 has a VDC circuit 262, A/D converter 22, a logic circuit 264, and selectors 52, 72 integrated on one semiconductor chip. Each circuit has a dedicated input/output terminal.

VDC circuit 262 includes reference voltage generating circuit 26, differential amplifier 28, a voltage conversion circuit 268, and a register 266. A/D converter 22 includes register 32 storing an A/D conversion result.

Logic circuit 264 includes first register 84, second register 86, third register 88, and operation unit 89.

With regard to the power supply, VDC circuit 262 is supplied with power supply voltage VCC via terminal 2, and A/D converter 22 is supplied with power supply voltage AVCC via terminal 12. Voltage VDCout which is the output of VDC circuit 262 is supplied to logic circuit 264. In other words, VDC circuit 262, A/D converter 22 and logic circuit 264 operate by receiving separate power supply voltages respectively. Here, ground voltage VSS, that is, ground, is common to these three circuits.

Upon receiving power supply voltage VCC, VDC circuit 262 internally generates reference voltage VDCref and outputs voltage VDCout as the output. A/D converter 22 subjects two analog input signals provided to input nodes AN0', AN1' to A/D conversion referring to reference voltage Avref for A/D conversion, and a conversion result is stored in register 32.

Selector 52 is a two-input selector, and has its output connected to input node AN0' of the A/D converter. Selector 72 is also a two-input selector, and has its output connected to input node AN1' of A/D converter 22.

Analog signal AN0 provided via terminal 54 is provided to one input of selector 52, and voltage VDCout which is the output of voltage conversion circuit 268 is provided to the other input thereof. In addition, analog signal AN1 provided via terminal 10 is provided to one input of selector 72, and reference voltage VDCref which is the output of reference voltage generating circuit 98 is provided to the other input of selector 72.

Logic circuit 264 communicates signals I/O1 to I/On via n terminals 16–18 as a control signal or data. Logic circuit 264 also inputs/outputs data in the embedded register via terminals 100 to 102 as data D1 to Dm.

VDC circuit 262 includes reference voltage generating circuit 98, differential amplifier 28, and voltage conversion circuit 268. Reference voltage generating circuit 98 generates reference voltage VDCref serving as the reference of voltage VDCout which is the output of VDC circuit 262. Differential amplifier 28 receives voltage VDCref and voltage VDCout as inputs. Differential amplifier 28 outputs a control signal to voltage conversion circuit 268 so as to raise voltage VDCout, if voltage VDCout is lower than voltage VDCref.

On the other hand, differential amplifier 28 outputs a control signal to voltage conversion circuit 268 so as not to raise voltage VDCout, if voltage VDCout is higher than voltage VDCref. Upon receiving the control signal from differential amplifier 28, voltage conversion circuit 268 generates a prescribed voltage VDCout lower than power supply voltage VCC from the same.

An operation of A/D converter 22 can be set by a signal from logic circuit 264. A/D converter 22 subjects analog signals input from input nodes AN0', AN1' to A/D conversion, and a conversion result is stored in register 32 as a digital value.

Logic circuit 264 outputs signals ADSEL0, ADSEL1 for selecting inputs of selectors 52, 72. Logic circuit 264 can also read the value in register 32 in A/D converter 22.

Logic circuit 264 includes first register 84, second register 86, third register 88, and operation unit 89. Logic circuit 264 can store in third register 88, a result obtained by subtracting a value in second register 86 from a value in first register 84 by means of operation unit 89.

Register 266 arranged in VDC circuit 262 stores a control value for modifying an operation mode of the VDC circuit. Depending on the value set in register 266, one of three modes of a VDC normal operation mode, a VDC through mode and a VDC stop mode can be selected. In the VDC normal operation mode, VDC circuit 262 attains the normal operation described above. In the VDC through mode, reference voltage generating circuit 26 and differential amplifier 28 stop their operations, and voltage conversion circuit 268 outputs input power supply voltage VCC substantially as it is without performing voltage conversion. In the VDC stop mode, VDC circuit 262 stops its operation and voltage VDCout is inactivated. Though register 266 is provided in VDC circuit 262 in FIG. 19, it may be arranged in logic circuit 264.

Figure 20:
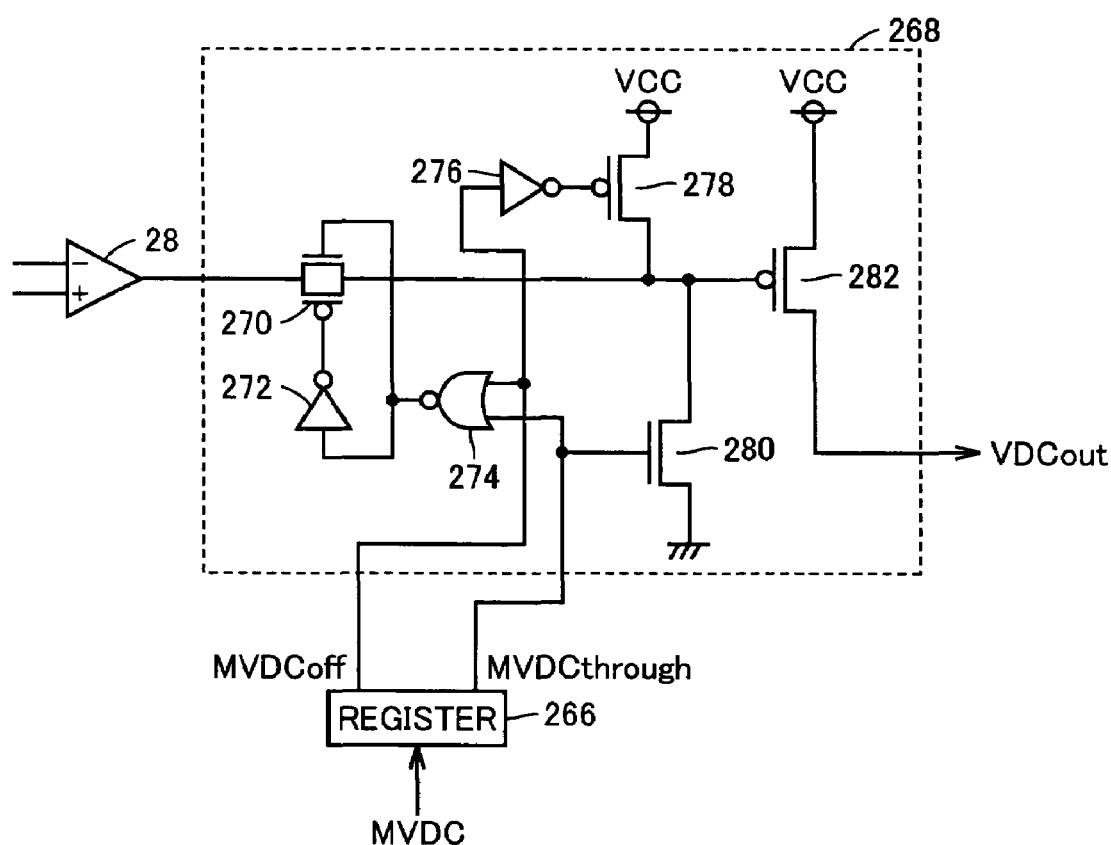
FIG. 20 is a circuit diagram showing a configuration of a voltage conversion circuit 268 in FIG. 19.

FIG. 20 is a circuit diagram showing a configuration of voltage conversion circuit 268 in FIG. 19.

Referring to FIG. 20, voltage conversion circuit 268 includes a P-channel MOS transistor 282 connected between the power supply node and a node outputting voltage VDCout; an NOR circuit 274 receiving signals MVDCoff, MVDCthrough; an inverter receiving and inverting an output of NOR circuit 274; and a transmission gate 270 connecting an output of differential amplifier 28 to the gate of P-channel MOS transistor 282 in response to the output of NOR circuit 274 and an output of inverter 272. Here, signal MVDCoff is activated in the VDC stop mode, while signal MVDCthrough is activated in the VDC through mode. A setting is written in register 266 in response to a mode setting signal MVDC output from logic circuit 264 in FIG. 19, and signals MVDCoff and MVDCthrough are activated/inactivated in accordance with this setting.

Voltage conversion circuit 268 further includes an inverter 276 receiving and inverting signal MVDCoff; a P-channel MOS transistor 278 connected between the power supply node and the gate of P-channel MOS transistor 282 and receiving an output of inverter 276 at its gate; and an N-channel MOS transistor 280 connected between the gate of P-channel MOS transistor 282 and the ground node and receiving signal MVDCthrough at its gate.

When signal MVDCoff is activated, transmission gate 270 is rendered non-conductive, and the output of differential amplifier 28 is isolated from the gate of P-channel MOS transistor 282. When P-channel MOS transistor 278 is rendered conductive, the gate of P-channel MOS transistor 282 is coupled to power supply voltage VCC. Consequently, P-channel MOS transistor 282 is rendered non-conductive, and voltage VDCout is inactivated.

On the other hand, when signal MVDCthrough is activated, transmission gate 270 is rendered non-conductive, and the gate of P-channel MOS transistor 282 is isolated from the output of differential amplifier 28. When N-channel MOS transistor 280 is rendered conductive, P-channel MOS transistor 282 is also rendered conductive. Consequently, power supply voltage VCC is output substantially as it is as voltage VDCout.

Referring back to FIG. 19, an overall operation of semiconductor integrated circuit 260 will now be described.

First, signal MVDC is output from logic circuit 264, and a value is written in register 266 in response to this signal. A writing operation is performed in such a manner that a part of signals 1101 to I/On is input as a writing instruction signal via terminals 16 to 18 from the outside of semiconductor integrated circuit 260, and data D1 to Dm is input as write data via terminals 100 to 102.

First, in the VDC normal operation mode, VDC circuit 262 operates as described in Embodiment 5 or the like.

Then, when the VDC through mode is set, in VDC circuit 262, a voltage substantially equal to (slightly lower than) power supply voltage VCC is output as voltage VDCout.

Selection signal ADSEL0 for selecting an input to A/D converter 22 is output from logic circuit 264, and in response to this, selector 52 provides voltage VDCout to input node AN0' of A/D converter 22. Voltage VDCout is subjected to A/D conversion by the A/D converter, and a conversion result is stored in register 32. The value in register 32 is read by logic circuit 264, and a digital value corresponding to voltage VDCout is stored in first register 84.

The content in first register 84 in logic circuit 264 can be read via terminals 100 to 102 from the outside of semiconductor integrated circuit 260.

When the VDC stop mode is set, voltage conversion circuit 268 does not drive voltage VDCout. Therefore, logic circuit 264 cannot operate. In such a case, reset (not shown) is input, or alternatively, power supply voltage VCC is once turned off and thereafter turned on again.

According to Embodiment 13, the VDC through mode is provided in VDC circuit 262. Accordingly, whether or not power supply voltage VCC input to the semiconductor integrated circuit is an expected value can be known as a digital signal from the outside of the semiconductor integrated circuit.

In addition, if voltage VDCout enabling an operation of logic circuit 264 cannot be obtained in the VDC normal operation mode such as when power supply voltage VCC is lowered, a transition to the VDC through mode may be made. In this manner, a semiconductor integrated circuit adapted to fluctuation of power supply voltage VCC in a flexible manner can be obtained.

[Embodiment 14]

Figure 21:
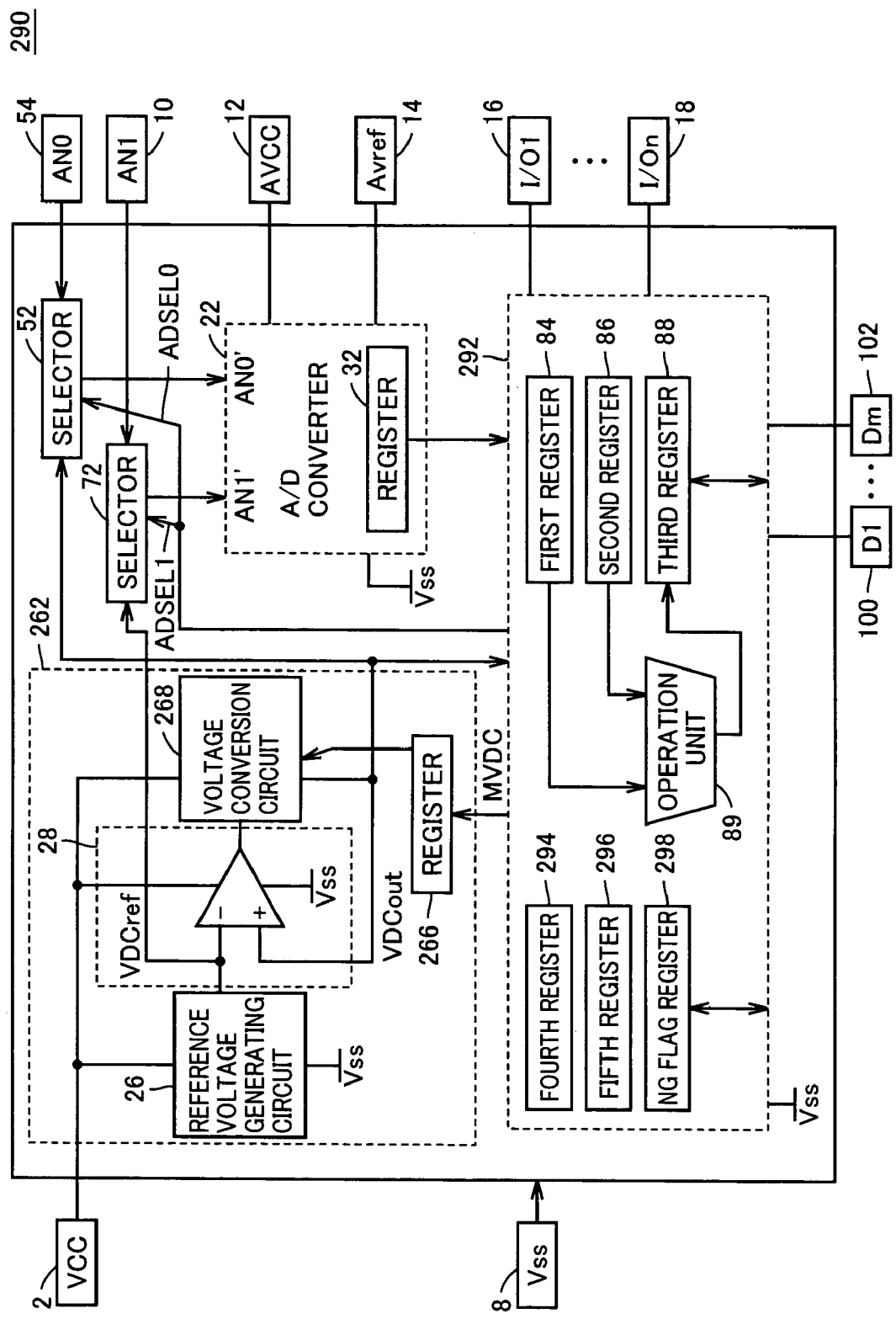
FIG. 21 is a block diagram showing a configuration of a semiconductor integrated circuit 290 in Embodiment 14.

FIG. 21 is a block diagram showing a configuration of a semiconductor integrated circuit 290 in Embodiment 14.

Referring to FIG. 21, semiconductor integrated circuit 290 includes VDC circuit 262, A/D converter 22, a logic circuit 292, and selectors 52, 72, and these components are integrated on one semiconductor chip. Each circuit has a dedicated input/output terminal.

VDC circuit 262 includes reference voltage generating circuit 26, differential amplifier 28, voltage conversion circuit 268, and register 266. A/D converter 22 includes register 32 storing an A/D conversion result. Logic circuit 292 includes first register 84, second register 86, third register 88, and operation unit 89. Logic circuit 292 further includes a fourth register 294, a fifth register 296, and an NG flag register 298.

With regard to the power supply, VDC circuit 262 is supplied with power supply voltage VCC via terminal 2, and A/D converter 22 is supplied with power supply voltage AVCC via terminal 12. Voltage VDCout which is the output of VDC circuit 262 is supplied to logic circuit 292. In other words, VDC circuit 262, A/D converter 22 and logic circuit 292 operate by receiving separate power supply voltages respectively. Here, ground voltage VSS, that is, ground, is common to these three circuits.

Upon receiving power supply voltage VCC, VDC circuit 262 internally generates reference voltage VDCref and outputs voltage VDCout as the output. A/D converter 22 subjects two analog input signals provided to input nodes AN0', AN1' to A/D conversion referring to reference voltage Avref for A/D conversion, and a conversion result is stored in register 32.

Selector 52 is a two-input selector, and has its output connected to input node AN0' of the A/D converter. Selector 72 is also a two-input selector, and has its output connected to input node AN1' of A/ID converter 22.

Analog signal AN0 provided via terminal 54 is provided to one input of selector 52, and voltage VDCout which is the output of voltage conversion circuit 268 is provided to the other input thereof. In addition, analog signal AN1 provided via terminal 10 is provided to one input of selector 72, and reference voltage VDCref which is the output of reference voltage generating circuit 98 is provided to the other input of selector 72.

Logic circuit 292 communicates signals I/O1 to I/On via n terminals 16–18 as a control signal or data. Logic circuit 292 also inputs/outputs data in the embedded register via terminals 100 to 102 as data D1 to Dm.

Reference voltage generating circuit 98 generates reference voltage VDCref serving as the reference of voltage VDCout which is the output of VDC circuit 262. Differential amplifier 28 receives voltage VDCref and voltage VDCout as inputs. Differential amplifier 28 outputs a control signal to voltage conversion circuit 268 so as to raise voltage VDCout, if voltage VDCout is lower than voltage VDCref.

On the other hand, differential amplifier 28 outputs a control signal to voltage conversion circuit 268 so as not to raise voltage VDCout, if voltage VDCout is higher than voltage VDCref. Upon receiving the control signal from differential amplifier 28, voltage conversion circuit 268 generates a prescribed voltage VDCout lower than power supply voltage VCC from the same.

An operation of A/D converter 22 can be set by a signal from logic circuit 292. A/D converter 22 subjects analog signals input from input nodes AN0', AN1' to A/D conversion, and a conversion result is stored in register 32 as a digital value.

Logic circuit 292 outputs signals ADSEL0, ADSEL1 for selecting inputs of selectors 52, 72. Logic circuit 292 can read the value in register 32 in A/D converter 22. Logic circuit 292 can store in third register 88, a result obtained by subtracting a value in second register 86 from a value in first register 84 by means of operation unit 89.

Register 266 arranged in VDC circuit 262 stores a control value for modifying an operation mode of the VDC circuit. Depending on the value set in register 266, one of three modes of the VDC normal operation mode, the VDC through mode and the VDC stop mode can be selected. In the VDC normal operation mode, VDC circuit 262 attains the normal operation described above. In the VDC through mode, reference voltage generating circuit 26 and differential amplifier 28 stop their operations, and voltage conversion circuit 268 outputs input power supply voltage VCC substantially as it is as voltage VDCout without performing voltage conversion. In the VDC stop mode, VDC circuit 262 stops its operation and voltage VDCout is inactivated.

One characteristic of Embodiment 14 is that logic circuit 292 further includes fourth register 294 and fifth register 296 in addition to the first to third registers. Fourth register 294 stores an upper limit value of power supply voltage VCC, while fifth register 296 stores a lower limit value of power supply voltage VCC. In addition, if the value stored in first register 84 is not within a range between values designated by fourth register 294 and fifth register 296, logic circuit 292 activates a flag stored in NG flag register 298.

An overall operation of semiconductor integrated circuit 290 will now be described.

First, signal MVDC is output from logic circuit 292, and a value is written in register 266 in response to this signal. A writing operation is performed in such a manner that a part of signals I/O1 to I/On is input as a writing instruction signal via terminals 16 to 18 from the outside of semiconductor integrated circuit 290, and data D1 to Dm is input as write data via terminals 100 to 102.

First, in the VDC normal operation mode, VDC circuit 262 operates as described in Embodiment 5 or the like.

Then, when the VDC through mode is set, VDC circuit 262 outputs a voltage substantially equal to (slightly lower than) power supply voltage VCC as voltage VDCout.

Selection signal ADSEL0 for selecting an input to A/D converter 22 is output from logic circuit 292, and in response to this, selector 52 provides voltage VDCout to input node AN0' of A/D converter 22. Voltage VDCout is subjected to A/D conversion by the A/D converter, and a conversion result is stored in register 32. The value in register 32 is read by logic circuit 292, and a digital value corresponding to voltage VDCout is stored in first register 84.

The content in first register 84 in logic circuit 292 can be read via terminals 100 to 102 from the outside of semiconductor integrated circuit 290.

The value in first register 84 is compared with the values in fourth register 294 and fifth register 296 under the control of logic circuit 292. If the value in first register 84 is not within a range between the values designated by fourth register 294 and fifth register 296, logic circuit 292 activates an NG flag.

The values in fourth register 294 and fifth register 296 can be read and written from the outside of semiconductor integrated circuit 290. The value in NG flag register 298 can be read and cleared from the outside of semiconductor integrated circuit 290.

In Embodiment 14, voltage VDCout corresponding to power supply voltage VCC is output in the VDC through mode. Whether or not voltage VDCout is within a predefined voltage range can be checked by reading a flag. In this manner, power supply voltage VCC can be monitored.

[Embodiment 15]

Figure 22:
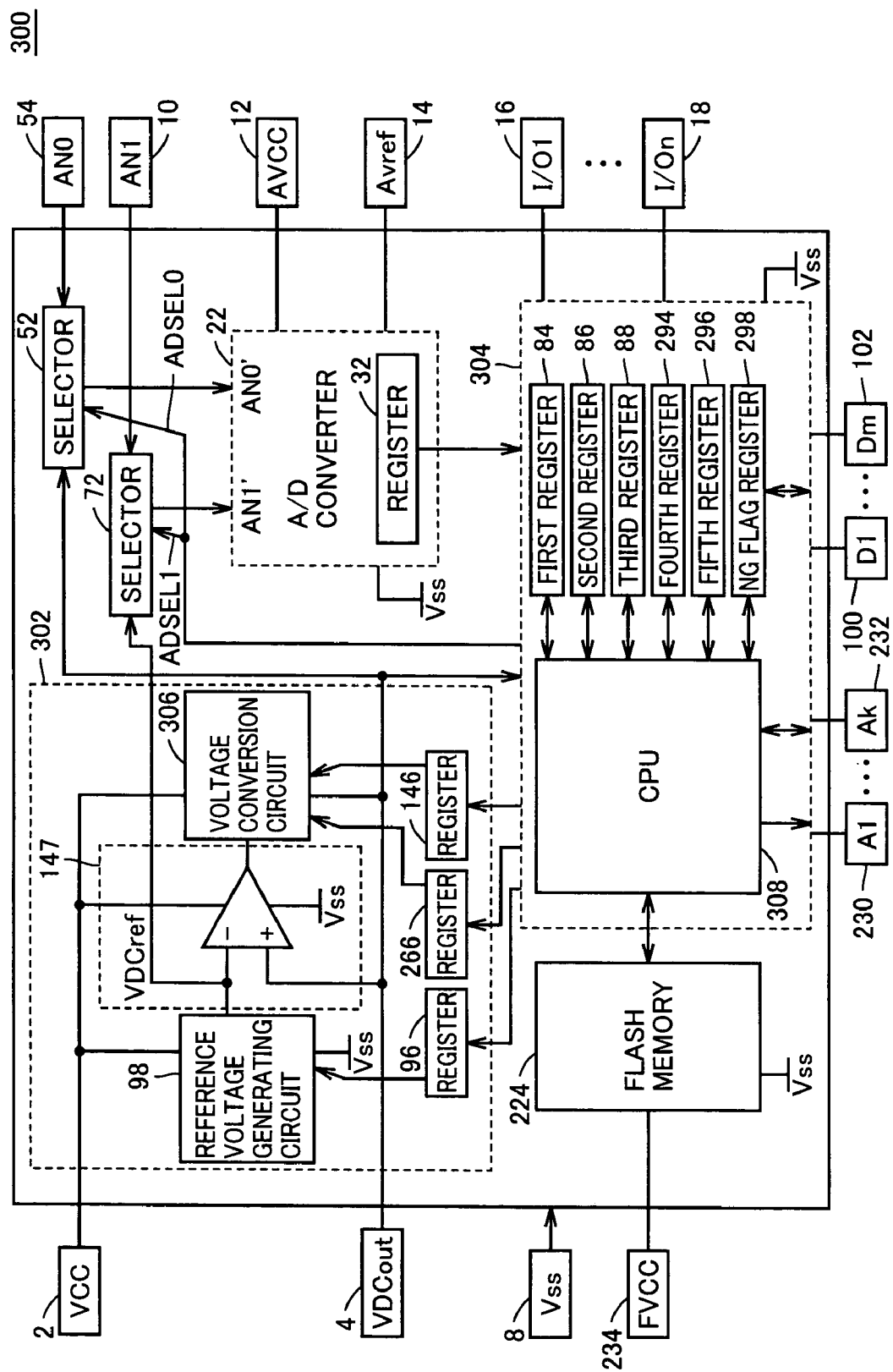
FIG. 22 is a block diagram showing a configuration of a semiconductor integrated circuit 300 in Embodiment 15.

FIG. 22 is a block diagram showing a configuration of a semiconductor integrated circuit 300 in Embodiment 15.

Referring to FIG. 22, semiconductor integrated circuit 300 includes a VDC circuit 302, A/D converter 22, a logic circuit 304, flash memory 224, and selectors 52, 72, and these components are integrated on one semiconductor chip.

VDC circuit 302 includes reference voltage generating circuit 98, differential amplifier 147, voltage conversion circuit 306, and registers 96, 146 and 266.

A/D converter 22 includes register 32 storing an A/D conversion result.

Logic circuit 304 includes a CPU 308, first register 84, second register 86, third register 88, fourth register 294, fifth register 296, and NG flag register 298.

VDC circuit 302 is supplied with power supply voltage VCC, while the A/D converter is supplied with power supply voltage AVCC. Logic circuit 304 is supplied with voltage, VDCout which is the output of VDC circuit 302 as the operation power supply voltage. In addition, flash memory 224 is externally supplied with power supply voltage FVCC. In other words, respective circuit blocks operate by receiving separate operation power supply voltages. Here, ground voltage VSS, that is, ground is common for each block.

VDC circuit 302 includes reference voltage generating circuit 98, differential amplifier 147, voltage conversion circuit 306, and registers 96, 146 and 266. VDC circuit 302 receives power supply voltage VCC from the outside, and outputs reference voltage VDCref which is the output of reference voltage generating circuit 98 and voltage VDCout which is the output of voltage conversion circuit 306.

A/D converter 22 receives power supply voltage AVCC as the operation power supply voltage. A/D converter 22 receives reference voltage Avref for A/D conversion via terminal 14.

Selector 52 selects one of analog signal AN0 and voltage VDCout in accordance with signal ADSEL0 provided from logic circuit 304, and provides the selected one to input node AN0' of A/D converter 22. Selector 72 selects one of reference voltage VDCref and analog signal AN1 in accordance with signal ADSEL1, and provides the selected one to input node AN1' of A/D converter 22.

Logic circuit 304 inputs/outputs signals I/O1 to I/On which are control signals or data signals via n terminals 16–18 to/from the outside of semiconductor integrated circuit 300. In addition, logic circuit 304 provides/receives as data D1 to Dm via m terminals 100 to 102, data in the register or the data read/written by CPU 308. Logic circuit 304 outputs address values A1 to Ak output by CPU 308 via terminals 230 to 232.

Reference voltage generating circuit 98 generates reference voltage VDCref serving as the reference of voltage VDCout of VDC circuit 302. Differential amplifier 147 receives and compares voltage VDCref and voltage VDCout.

Differential amplifier 147 transmits a control signal to voltage conversion circuit 306 so as to raise voltage VDCout, if voltage VDCout is lower than voltage VDCref. On the other hand, differential amplifier 147 transmits a control signal to voltage conversion circuit 306 so as not to raise voltage VDCout, if voltage VDCout is higher than voltage VDCref.

In response to the control signal from differential amplifier 147, voltage conversion circuit 306 generates a prescribed voltage VDCout lower than power supply voltage VCC from the same.

An operation of A/D converter 22 can be set by a signal from logic circuit 304. A/D converter 22 subjects analog signals input from input nodes AN0', AN1' to A/D conversion, and a conversion result is stored in register 32 as a digital value.

Logic circuit 304 outputs signals ADSEL0, ADSEL1 for selecting inputs of selectors 52, 72. Logic circuit 304 can also read the value in register 32 in A/D converter 22. In addition, logic circuit 304 can store in third register 88, a result obtained by subtracting a value for reference voltage VDCref held in the second register from a value for voltage VDCout held in first register 84. This operation can be performed by utilizing a subtraction function of CPU 308.

As the configuration of reference voltage generating circuit 98 has been described in connection with FIG. 7, description thereof will not be repeated.

Figure 23:
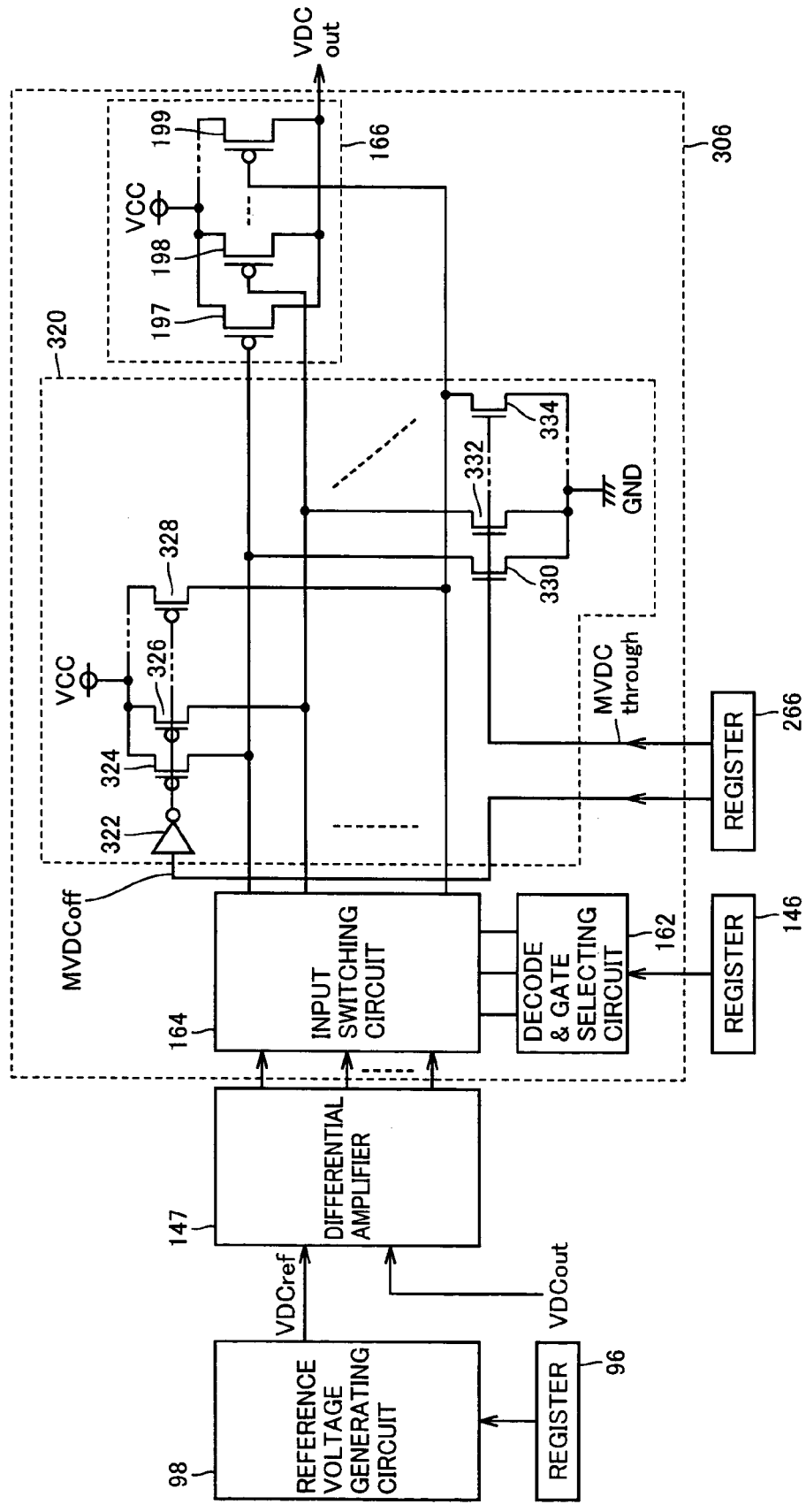
FIG. 23 is a circuit diagram showing a configuration of a voltage conversion circuit 306 in FIG. 22.

FIG. 23 is a circuit diagram showing a configuration of a voltage conversion circuit 306 in FIG. 22.

Referring to FIG. 23, voltage conversion circuit 306 includes decode & gate selecting circuit 162, input switching circuit 164, an input fix circuit 320, and driving circuit 166. As decode & gate selecting circuit 162, input switching circuit 164 and driving circuit 166 are the same as those described in connection with FIG. 9, description thereof will not be repeated.

Input fix circuit 320 includes an inverter 322 receiving and inverting signal MVDCoff output from register 266; a P-channel MOS transistor 324 connected between the power supply node and the gate of P-channel MOS transistor 197 and receiving an output of inverter 322 at the gate; a P-channel MOS transistor 326 connected between the power supply node and the gate of P-channel MOS transistor 198 and receiving the output of inverter 322 at the gate; and a P-channel MOS transistor 328 connected between the power supply node and the gate of P-channel MOS transistor 199 and receiving the output of inverter 322 at the gate.

Input fix circuit 320 further includes an N-channel MOS transistor 330 connected between the gate of P-channel MOS transistor 197 and the ground node and receiving signal MVDCthrough at the gate; an N-channel MOS transistor 332 connected between the gate of P-channel MOS transistor 198 and the ground node and receiving signal MVDCthrough at the gate; and an N-channel MOS transistor 334 connected between P-channel MOS transistor 199 and the ground node and receiving signal MVDCthrough at the gate.

Modification of the value set in register 96 can allow for modification of reference voltage VDCref, whereby voltage VDCout can be regulated. In addition, change in the setting of register 146 can allow for change in the number of driving transistors 197 to 199 to be used, whereby a speed responding to load current can be adjusted.

In addition, by setting the value in register 266, in the VDC stop mode, signal MVDCoff can be activated to H level, P-channel MOS transistors 197 to 199 are all set to non-conductive state, and voltage VDCout is inactivated.

Moreover, by setting register 266, in the VDC through mode, signal MVDCthrough is activated to H level, P-channel MOS transistors 197 to 199 all enter conductive state, and power supply voltage VCC is output as it is as voltage VDCout.

Referring back to FIG. 22, voltage conversion circuit 306 includes a plurality of driving transistors. Normally, a prescribed number of driving transistors operate. The number of driving transistors that operate can be varied in accordance with the value in register 146. Voltage conversion circuit 306 operates in such a manner that the number of driving transistors increases when the value in register 146 is negative, while the number of driving transistors decreases when the value in register 146 is positive. Here, register 146 may store the number of current driving transistors that operate, and voltage conversion circuit 306 may be configured such that the transistors in the number designated by register 146 operate.

Though register 146 is arranged in VDC circuit 302 in FIG. 22, register 146 may be arranged in logic circuit 304 or in another area. In addition, the value stored in register 146 can be read and written by logic circuit 304 containing CPU 308.

Reference voltage generating circuit 98 can provide an output voltage serving as the reference, one voltage or a plurality of voltages higher than the output voltage, and one voltage or a plurality of voltages lower than the output voltage. These voltages can be selected in accordance with the value in register 96. Though register 96 is arranged in VDC circuit 302 in FIG. 22, register 96 may be arranged in logic circuit 304 or in another area.

Register 264 arranged in VDC circuit 302 stores a control value for modifying an operation mode of the VDC circuit. Depending on the value set in register 266, one of three modes of the VDC normal operation mode, the VDC through mode and the VDC stop mode can be selected. In the VDC normal operation mode, VDC circuit 302 attains the normal operation described above. In the VDC through mode, reference voltage generating circuit 26 and differential amplifier 147 stop their operations, and voltage conversion circuit 306 outputs input power supply voltage VCC substantially as it is as voltage VDCout without performing voltage conversion. In the VDC stop mode, VDC circuit 302 stops its operation and voltage VDCout is inactivated. Though register 266 is arranged in VDC circuit 302 in FIG. 22, register 266 may be arranged in logic circuit 304.

One characteristic of Embodiment 15 is that logic circuit 304 further includes fourth register 294 and fifth register 296 in addition to the first to third registers. Fourth register 294 stores the upper limit value of power supply voltage VCC, while fifth register 296 stores the lower limit value of power supply voltage VCC. In addition, if the value stored in first register 84 is not within a range between values designated by fourth register 294 and fifth register 296, logic circuit 304 activates a flag stored in NG flag register 298.

An overall operation of semiconductor integrated circuit 300 will now be described.

In flash memory 224, an instruction string executed by CPU 308 and data used when the instruction is executed are stored. An instruction string for CPU (program) for executing the operation in Embodiment 15 and a parameter (data) used for such an instruction are also stored in flash memory 224. When a user requests start-up of that program from other programs, or at power-on or reset of semiconductor integrated circuit 300, that program stored in flash memory 224 can be executed.

Under the control of CPU 308 operated by the program started up in this manner, a value is written in register 266 controlling the operation mode.

First, in the VDC normal operation mode, VDC circuit 302 operates as described in Embodiment 5 or the like.

Then, when the VDC through mode is set, VDC circuit 302 outputs a voltage substantially equal to (slightly lower than) power supply voltage VCC as voltage VDCout.

Selection signal ADSEL0 for selecting an input to A/D converter 22 is output from logic circuit 304, and in response to this, selector 52 provides voltage VDCout to input node AN0' of A/D converter 22. Voltage VDCout is subjected to A/D conversion by the A/D converter, and a conversion result is stored in register 32. The value in register 32 is read by logic circuit 304, and a digital value corresponding to voltage VDCout is stored in first register 84.

The content in first register 84 in logic circuit 304 can be read via terminals 100 to 102 from the outside of semiconductor integrated circuit 300.

When the VDC stop mode is set, voltage conversion circuit 306 does not drive voltage VDCout. Therefore, logic circuit 304 cannot operate. In such a case, reset (not shown) is input, or alternatively, power supply voltage VCC is once turned off and thereafter turned on again.

In the operation in the VDC through mode, the content in first register 84 is compared with the values in fourth register 294 and fifth register 296. If the value in first register 84 is not found between the value in fourth register 294 and the value in fifth register 296, the NG flag is activated. The value in each register or the content of the NG flag is provided to the outside of semiconductor integrated circuit 300 via input/output terminals 16 to 18 or terminals 100 to 102 connected to the data bus.

As described above, in Embodiment 15, the VDC through mode is provided in VDC circuit 302, and power supply voltage VCC can externally be observed as a digital value. In addition, as the CPU operated by the program stored in the flash memory is mounted, control of power supply voltage VCC can readily be performed. In other words, by varying the parameter in the flash memory, the upper limit value and the lower limit value of power supply voltage VCC can be modified in accordance with a system.

If power supply voltage VCC is lowered and necessary voltage VDCout cannot be obtained in the operation of VDC circuit 302 in the normal mode, switch to the VDC through mode is made, and a voltage supplied to logic circuit 304 is increased, whereby necessary information can be saved in the flash memory.

[Embodiment 16]

Figure 24:
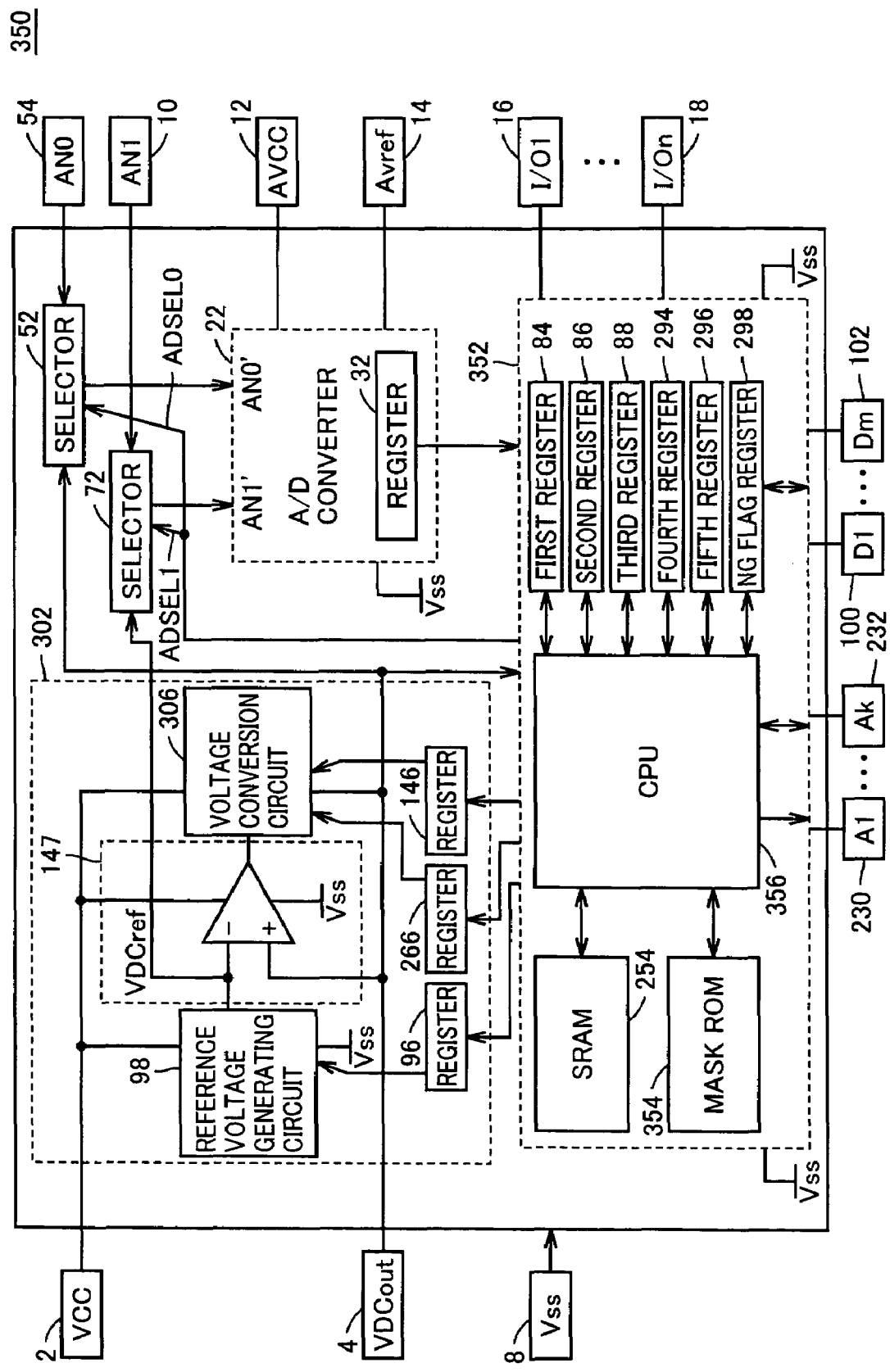
FIG. 24 is a block diagram showing a configuration of a semiconductor integrated circuit 350 in Embodiment 16.

FIG. 24 is a block diagram showing a configuration of a semiconductor integrated circuit 350 in Embodiment 16.

Referring to FIG. 24, semiconductor integrated circuit 350 includes VDC circuit 302, A/D converter 22, a logic circuit 352, and selectors 52, 72, and these circuits are integrated on one semiconductor chip. Each circuit has a dedicated input/output terminal.

Here, a power supply will be described. VDC circuit 302 receives power supply voltage VCC via terminal 2, while A/D converter 22 receives power supply voltage AVCC via terminal 12. Logic circuit 352 containing CPU 356 receives voltage VDCout which is the output of VDC circuit 302 as the power supply voltage. In other words, respective circuit blocks operate by receiving separate power supply voltages. Here, ground voltage VSS, that is, ground is common for each block.

VDC circuit 302 includes reference voltage generating circuit 98, differential amplifier 147, voltage conversion circuit 306, and registers 96, 146 and 266. VDC circuit 302 receives power supply voltage VCC from the outside, and outputs reference voltage VDCref which is the output of reference voltage generating circuit 98 and voltage VDCout which is the output of voltage conversion circuit 306.

A/D converter 22 receives power supply voltage AVCC as the operation power supply voltage. A/D converter 22 receives reference voltage Avref for A/D conversion via terminal 14.

Selector 52 selects one of analog signal AN0 and voltage VDCout in accordance with signal ADSEL0 provided from logic circuit 352, and provides the selected one to input node AN0' of A/D converter 22. Selector 72 selects one of reference voltage VDCref and analog signal AN1 in accordance with signal ADSEL1, and provides the selected one to input node AN1' of A/D converter 22.

Logic circuit 352 includes a CPU 356, first register 84, second register 86, third register 88, SRAM 254, and a mask ROM 354. Logic circuit 352 inputs/outputs signals I/O1 to I/On which are control signals or data signals via n terminals 16–18 to/from the outside of semiconductor integrated circuit 350. In addition, logic circuit 352 provides/receives as data D1 to Dm via m terminals 100 to 102, data in the register or the data read/written by CPU 356. Logic circuit 352 outputs address values A1 to Ak output by CPU 356 via terminals 230 to 232.

Reference voltage generating circuit 98 generates reference voltage VDCref serving as the reference of output voltage VDCout of VDC circuit 302. Differential amplifier 147 receives and compares voltage VDCref and voltage VDCout.

Differential amplifier 147 transmits a control signal to voltage conversion circuit 306 so as to raise voltage VDCout, if voltage VDCout is lower than voltage VDCref. On the other hand, differential amplifier 147 transmits a control signal to voltage conversion circuit 306 so as not to raise voltage VDCout, if voltage VDCout is higher than voltage VDCref. In response to the control signal from differential amplifier 147, voltage conversion circuit 306 generates a prescribed voltage VDCout lower than power supply voltage VCC from the same.

An operation of A/D converter 22 can be set by a signal from logic circuit 352. A/D converter 22 subjects analog signals input from input nodes AN0', AN1' to A/D conversion, and a conversion result can be stored in register 32 as a digital value.

Logic circuit 352 outputs signals ADSEL0, ADSEL1 for selecting inputs of selectors 52, 72. Logic circuit 352 can also read the value in register 32 in A/D converter 22. In addition, logic circuit 352 can store in third register 88, a result obtained by subtracting a value for reference voltage VDCref held in the second register from a value for voltage VDCout held in first register 84. This operation can be performed by utilizing a subtraction function of CPU 356.

As the configuration of reference voltage generating circuit 98 and voltage conversion circuit 306 has been described in connection with FIGS. 7 and 23, description thereof will not be repeated.

Voltage conversion circuit 306 includes a plurality of driving transistors. Normally, a prescribed number of driving transistors operate. The number of driving transistors that operate can be varied in accordance with the value in register 146. Voltage conversion circuit 306 operates in such a manner that the number of driving transistors increases when the value in register 146 is negative, while the number of driving transistors decreases when the value in register 146 is positive. Here, register 146 may store the number of current driving transistors that operate, and voltage conversion circuit 306 may be configured such that the transistors in the number designated by register 146 operate.

Though register 146 is arranged in VDC circuit 302 in FIG. 24, register 146 may be arranged in logic circuit 352 or in another area. In addition, the value stored in register 146 can be read and written by logic circuit 352 containing CPU 356.

Register 266 arranged in VDC circuit 302 stores a control value for modifying an operation mode of the VDC circuit. Depending on the value set in register 266, one of three modes of the VDC normal operation mode, the VDC through mode and the VDC stop mode can be selected.

In the VDC normal operation mode, VDC circuit 302 attains the normal operation described above. In the VDC through mode, reference voltage generating circuit 26 and differential amplifier 147 stop their operations, and voltage conversion circuit 306 outputs input power supply voltage VCC substantially as it is as voltage VDCout without performing voltage conversion. In the VDC stop mode, VDC circuit 302 stops its operation and voltage VDCout is inactivated. Though register 266 is arranged in VDC circuit 302 in FIG. 24, register 266 may be arranged in logic circuit 352.

One characteristic of Embodiment 16 is that logic circuit 352 further includes fourth register 294 and fifth register 296 in addition to the first to third registers. Fourth register 294 stores the upper limit value of power supply voltage VCC, while fifth register 296 stores the lower limit value of power supply voltage VCC. In addition, if the value stored in first register 84 is not within a range between the values designated by fourth register 294 and fifth register 296, logic circuit 352 activates a flag stored in NG flag register 298.

An overall operation of semiconductor integrated circuit 350 will now be described.

An instruction string executed by CPU 356 and data used when the instruction is executed are stored in a memory device (not shown) such as an EEPROM arranged outside semiconductor integrated circuit 350.

In mask ROM 354, a program (boot program) for loading the instruction string and the data in the memory device to SRAM 254 and transferring the operation of CPU 356 to the loaded program is stored.

The boot program operates at reset of semiconductor integrated circuit 350 or when another program in the mask ROM requests start-up of the boot program. In the following, an operation by the program booted in SRAM 254 by the boot program at reset will be described.

Under the control of CPU 356 operated by the program started up in this manner, information for setting the mode is written in register 266.

First, in the VDC normal operation mode, VDC circuit 302 operates as described in Embodiment 5 or the like.

Then, when the VDC through mode is set, VDC circuit 302 outputs a voltage substantially equal to (slightly lower than) power supply voltage VCC as voltage VDCout.

Selection signal ADSEL0 for selecting an input to A/D converter 22 is output from logic circuit 352, and in response to this, selector 52 provides voltage VDCout to input node AN0' of A/D converter 22. Voltage VDCout is subjected to A/D conversion by the A/D converter, and a conversion result is stored in register 32. The value in register 32 is read by logic circuit 352, and a digital value corresponding to voltage VDCout is stored in first register 84.

The content in first register 84 in logic circuit 352 can be read via terminals 100 to 102 from the outside of semiconductor integrated circuit 350.

When the VDC stop mode is set, voltage conversion circuit 306 does not drive voltage VDCout. Therefore, logic circuit 352 cannot operate. In such a case, reset (not shown) is input, or alternatively, power supply voltage VCC is once turned off and thereafter turned on again.

In the operation in the VDC through mode, the content in first register 84 is compared with the values in fourth register 294 and fifth register 296. If the value in first register 84 is not found between the value in fourth register 294 and the value in fifth register 296, the NG flag is activated. The value in each register or the content of the NG flag is provided to the outside of semiconductor integrated circuit 350 via input/output terminals 16 to 18 or terminals 100 to 102 connected to the data bus.

As described above, in Embodiment 16, the VDC through mode is provided in VDC circuit 302. Accordingly, power supply voltage VCC input to the VDC circuit can be observed as a digital value. In addition, a boot program is provided on mask ROM 354, and a prescribed program is loaded to SRAM 254. Mounting of CPU 356 operated by the loaded program facilitates control of power supply voltage VCC. In other words, an abnormal state such as lowering of power supply voltage VCC can be detected, and the upper limit value and the lower limit value of power supply voltage VCC can be modified in accordance with the system by modifying a parameter in the EEPROM arranged outside semiconductor integrated circuit 350.

Moreover, in Embodiment 16, the program is loaded from the EEPROM or the like arranged outside to embedded SRAM 254 by the boot program on mask ROM 354, and the program is executed by CPU 356. Therefore, the number of steps in a wafer process can be reduced as compared with an example in which a flash memory is mounted. Thus, manufacturing cost for the semiconductor integrated circuit can be lowered.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
   a first terminal receiving an external power supply voltage provided from outside;
   a voltage generating circuit lowering said external power supply voltage and generating an internal voltage;
   an internal circuit using said internal voltage;
   an A/D conversion circuit converting said internal voltage from an analog value to a digital value so as to output a digital signal to the outside; and
   a second terminal providing said digital signal to the outside, wherein
   said internal voltage is an operation power supply voltage of said internal circuit, and
   said voltage generating circuit includes
   a reference voltage generating circuit generating a reference voltage of said operation power supply voltage,
   a differential amplifying circuit receiving said operation power supply voltage and said reference voltage at complementary two inputs, and
   a voltage conversion circuit converting said external power supply voltage in response to an output of said differential amplifying circuit so as to output said operation power supply voltage.

2. A semiconductor integrated circuit comprising:
   a first terminal receiving an external power supply voltage provided from outside;
   a voltage generating circuit lowering said external power supply voltage and generating an internal voltage;
   an internal circuit using said internal voltage;
   an A/D conversion circuit converting said internal voltage from an analog value to a digital value so as to output a digital signal to the outside; and
   a second terminal providing said digital signal to the outside, wherein
   said internal voltage is a reference voltage serving as a reference of an operation power supply voltage of said internal circuit, and
   said voltage generating circuit includes
   a reference voltage generating circuit generating said reference voltage,
   a differential amplifying circuit receiving said operation power supply voltage and said reference voltage at complementary two inputs, and
   a voltage conversion circuit converting said external power supply voltage in response to an output of said differential amplifying circuit so as to output said operation power supply voltage.

3. A semiconductor integrated circuit comprising:
   a first terminal receiving an external power supply voltage provided from outside;
   a voltage generating circuit lowering said external power supply voltage and generating an internal voltage;
   an internal circuit using said internal voltage;
   an A/D conversion circuit converting said internal voltage from an analog value to a digital value so as to output a digital signal to the outside; and a second terminal providing said digital signal to the outside, wherein said internal voltage is an operation power supply voltage of said internal circuit, said voltage generating circuit includes a reference voltage generating circuit generating a reference voltage, a differential amplifying circuit receiving said operation power supply voltage and said reference voltage at complementary two inputs, and a voltage conversion circuit converting said external power supply voltage in response to an output of said differential amplifying circuit so as to output said operation power supply voltage, said A/D conversion circuit receives said operation power supply voltage and said reference voltage at first an d second input nodes respectively, and converts said operation power supply voltage and said reference voltage to first and second digital values respectively, said internal circuit includes first and second registers temporarily holding said first and second digital values respectively, an operation circuit outputting a difference between said first and second digital values held in said first and second registers respectively as a third digital value, and a third register temporarily holding said third digital value, and the values held in said first to third registers are output from said second terminal.

4. The semiconductor integrated circuit according to claim 3, wherein said voltage generating circuit further includes a fourth register, and said reference voltage generating circuit regulates said reference voltage in accordance with a value held in said fourth register.

5. The semiconductor integrated circuit according to claim 3, wherein said voltage generating circuit further includes a fourth register, and said voltage conversion circuit adjusts drivability to drive a node outputting said internal power supply voltage in accordance with a value held in said fourth register.

6. The semiconductor integrated circuit according to claim 3, wherein said voltage generating circuit further includes a fuse circuit of which setting can be varied in a non-volatile manner, and said reference voltage generating circuit regulates said reference voltage in accordance with the setting of said fuse circuit.

7. The semiconductor integrated circuit according to claim 3, wherein said voltage generating circuit further includes a fuse circuit of which setting can be varied in a non-volatile manner, and said voltage conversion circuit adjusts drivability to drive a node outputting said internal power supply voltage in accordance with the setting of said fuse circuit.

8. The semiconductor integrated circuit according to claim 3, wherein said operation circuit is a central processing unit (CPU) performing an operation in accordance with an instruction string, and said semiconductor integrated circuit further includes a non-volatile memory circuit storing said instruction string.

9. The semiconductor integrated circuit according to claim 8, wherein said voltage generating circuit further includes a fourth register holding a regulation value for generated said internal voltage, said non-volatile memory circuit further holds an initial value of said regulation value, and said central processing unit rewrites a value held in said fourth register in accordance with the value held in said third register.

10. The semiconductor integrated circuit according to claim 8, further comprising an input terminal for setting for mode switching, wherein said central processing unit has a normal mode and a special mode as operation modes, in which special mode, a difference between said first and second digital values held in said first and second registers respectively is output as a third digital value, and said central processing unit makes a transition to said special mode in accordance with the setting of said input terminal at power-on.

11. The semiconductor integrated circuit according to claim 3, wherein said operation circuit is a central processing unit performing an operation in accordance with an instruction string, and said semiconductor integrated circuit further includes a non-volatile memory circuit storing said instruction string and prescribed information, and a volatile memory which is connected to said central processing unit and to which said prescribed information is loaded from said non-volatile memory circuit by a boot program which is a part of said instruction string.

12. The semiconductor integrated circuit according to claim 3, wherein said voltage conversion circuit has, as operation modes, a normal mode in which said external power supply voltage is lowered and a special mode in which said external power supply voltage is output without being converted, and in said special mode, said first digital value corresponds to said external power supply voltage and is output from said second terminal.

13. The semiconductor integrated circuit according to claim 3, wherein said internal circuit further includes a fourth register holding an upper limit value of said internal power supply voltage, and a fifth register holding a lower limit value of said internal power supply voltage, and said operation circuit outputs an abnormal flag when the value held in said first register is not in a range between said upper limit value and said lower limit value.

14. The semiconductor integrated circuit according to claim 13, wherein said operation circuit is a central processing unit performing an operation in accordance with an instruction string, and said semiconductor integrated circuit further includes a non-volatile memory circuit storing said instruction string.

15. The semiconductor integrated circuit according to claim 13, wherein said operation circuit is a central processing unit performing an operation in accordance with an instruction string, and said semiconductor integrated circuit includes a non-volatile memory circuit storing said instruction string and prescribed information, and a volatile memory which is connected to said central processing unit and to which said prescribed information is loaded from said non-volatile memory circuit by a boot program which is a part of said instruction string.

* * * * *